(12) United States Patent
Holger

(10) Patent No.: US 7,383,033 B2
(45) Date of Patent: Jun. 3, 2008

(54) DIFFERENTIAL AND QUADRATURE HARMONIC VCO AND METHODS THEREFOR

(75) Inventor: Kuhnert Holger, Uiwang-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 521 days.

(21) Appl. No.: 11/056,522

(22) Filed: Feb. 14, 2005

(65) Prior Publication Data

US 2005/0195643 A1 Sep. 8, 2005

(30) Foreign Application Priority Data

Feb. 14, 2004 (KR) ............... 10-2004-0009850

(51) Int. Cl.
*H04B 7/00* (2006.01)

(52) U.S. Cl. ............... 455/264; 455/258; 455/255

(58) Field of Classification Search ............... 455/264, 455/257, 258, 259, 260, 255, 130, 230; 331/57, 331/45, 46, 50
See application file for complete search history.

(56) References Cited

U.S. PATENT DOCUMENTS

| | | | | |
|---|---|---|---|---|
| 5,180,994 A * | 1/1993 | Martin et al. | ............... | 331/38 |
| 5,457,429 A * | 10/1995 | Ogawa et al. | ............... | 331/57 |
| 5,592,127 A * | 1/1997 | Mizuno | ............... | 331/57 |
| 5,748,048 A * | 5/1998 | Moyal | ............... | 331/34 |
| 5,917,383 A * | 6/1999 | Tso et al. | ............... | 331/57 |
| 5,936,475 A * | 8/1999 | Tchamov et al. | ............... | 331/57 |
| 6,177,846 B1 * | 1/2001 | Takada et al. | ............... | 331/57 |
| 6,348,839 B1 * | 2/2002 | Aramaki | ............... | 331/57 |
| 6,469,585 B1 * | 10/2002 | Dai et al. | ............... | 331/57 |
| 7,106,142 B2 * | 9/2006 | Lin | ............... | 331/57 |
| 7,161,437 B2 * | 1/2007 | Yoneya | ............... | 331/57 |

* cited by examiner

*Primary Examiner*—Sonny Trinh
(74) *Attorney, Agent, or Firm*—Staas & Halsey LLP

(57) ABSTRACT

A differential and quadrature harmonic voltage controlled oscillator (VCO), and a method for generating a differential and quadrature harmonic signal. The VCO may include a first oscillation unit for generating a first and a third signal, a first combining unit for combining the first and the third signal, a second oscillation unit for generating a second and a fourth signal, and a second combining unit for combining the second and the fourth signal. The phase of the second signal is determined through a phase-invert and delay using the first signal, the phase of the third signal is determined through a phase-invert and delay using the second signal, the phase of the fourth signal is determined through a phase-invert and delay using the third signal, and the phase of the first signal is determined through a phase-invert and delay using the fourth signal.

27 Claims, 17 Drawing Sheets

DIFFERENTIAL AND QUADRATURE HARMONIC VCO AND METHODS THEREFOR

CROSS-REFERENCE TO RELATED APPLICATIONS

This application claims benefit under 35 U.S.C. § 119 from Korean Patent Application No. 2004-9850 filed on Feb. 14, 2004, the entire content of which is incorporated herein by reference.

BACKGROUND OF THE INVENTION

1. Field of the Invention

The present invention relates in general to a voltage controlled oscillator (hereinafter, referred to as a 'VCO'), and more particularly, to a VCO generating multi-phase, multi-harmonic output signals.

2. Description of the Related Art

A voltage controlled oscillator (VCO) is an oscillator whose frequency is adjusted by controlling an applied voltage and changed capacitance of a variable capacitor.

VCOs are essential components in the architecture of all telecommunication systems. The VCO in modern data communication systems is employed as part of a phase locked loop (hereinafter, referred to as a 'PLL') that generates local oscillator (hereinafter, referred to as an 'LO') frequencies for an up and down conversion of a radio signal from/to a baseband of a transmitter and receiver. For example, according to the architecture of the transmitter-receiver, that is, single IF (Intermediate Frequency), dual IF, or direct conversion, a transmitter-receiver chip can include a certain number of VCO circuits for generating LO signals. To cope with spectral purity and phase noise of communication systems, each VCO is stabilized with the PLL. As for another problem in a dual-down conversion super-heterodyne radio, an input signal should be converted to a quadrature baseband signal at the last down-conversion operation. For this conversion, a quadrature phase LO signal (also called as a phase (I) and quadrature (Q) signal, or an IQ signal) is required. The IQ signal is generated by applying a poly-phase filter to outputs of a differential oscillator, or applying a divide-by-four circuit to a token ring structure, or employing various kinds of means such as coupled oscillators for example. These methods, however, not only have their own drawbacks and limits, but also make the transmitter and receiver more complicated than necessary. In the case of an RC poly-phase filter, it is known that the frequency with 90 degrees phase difference, caused by process deviation during the manufacture of integrated resistors, is considerably different from a design target frequency. Meanwhile, the divide-by-four circuit makes the structure of a transmitter and receiver more complicated. The conventional coupled oscillator also has many shortcomings, such as, its output power is not sufficient for a highest dynamic frequency or it has a very complicated coupled structure.

FIG. 1 illustrates a multiphase output oscillator using a logic inverter gate.

As shown in FIG. 1, according to the multiphase output oscillator disclosed in U.S. Pat. No. 5,592,126, a plurality of ring oscillators are serially coupled in a loop. None of the oscillators oscillates freely because each oscillator adjusts its successor all the way around the loop. A phase transition between two points in the loop is expressed as an integer fraction of 360 degrees, and is dependent on the number of oscillators. In the case of an integer multiple of four oscillators, the maximum phase transition is 90 degrees. Although a radio frequency in the multiphase output oscillator can be separated to a different phase, first and second harmonics are inseparable. Therefore, the disclosure can only be used as a quadrature generator, not as a harmonic generator. Another defect of the disclosure is that because the circuits are organized in a ring oscillator building block, without an additional circuit, sufficient RF outputs and satisfactory noise performance can not be obtained.

FIG. 2 illustrates two fixed-frequency oscillators coupled in a ring topology. Particularly, U.S. Pat. No. 6,188,292 discloses two interconnected oscillators where frequency variation is achieved by varying the coupling between the two oscillators. The coupling is varied by using a variable current or voltage source. However, this type of circuit can only be used as a quadrature generator, and is not appropriate for a harmonic generator.

FIG. 3A illustrates a related art wide-band or multi-band voltage controlled oscillator.

Particularly, U.S. Pat. No. 6,417,740 disclosed this type of the VCO, in which a pair of LC oscillator circuits are cross-coupled through a transconductance control circuit. Under the transconductance control, through NMOS varactor tuning (the varactors M13, M14, M15, and M16 controlled by a voltage Vcap) and current injection (circuits 340, 380 controlled by a voltage Vcon), the tuning range is from 900 MHz to 1.3 GHz, and from 1.3 GHz to 2.4 GHz. The quadrature output voltage is −10 dB, which corresponds to −18 dBm at the impedance of the load 50 ohm. This type of circuit may be effectively used with a quadrature oscillator for a wide-band receiver system, but is not appropriate for the harmonic generator.

FIG. 3B illustrates an embodiment of coupling for an LC-based VCO.

U.S. Pat. No. 6,492,877 disclosed this type of coupling, in which two LC VCO signals are coupled through couplers or buffers and coupling loops, and the two-stage coupling loop system provides in-phase and quadrature signals in two stages. However, neither simulation nor measurement data is given, and there is no way to find out signal magnitude and a maximum system frequency (speed). Although a detailed schematic circuit diagram is not provided, it would be sufficient to note that the buffers in the disclosure reduce the load capacity of each VCO, and presumably improve the "performance" of the oscillator (this is not mentioned). The disclosed coupling method is effective for generating quadrature phase signals, but cannot generate differential phase signals.

SUMMARY OF THE INVENTION

It is, therefore, an aspect of the present invention to provide a voltage controlled oscillator, and method therefore, generating a quadrature and differential phase output signal at a first harmonic and a differential phase output signal at a second harmonic.

Another aspect of the present invention is to provide a voltage controlled oscillator with an improved RF voltage, so that a second harmonic signal can be used without much amplification.

It is still another aspect of the present invention to provide a voltage controlled oscillator with an improved tuning range and a simple structure.

Additional aspects and/or advantages of the invention will be set forth in part in the description which follows and, in part, will be obvious from the description, or may be learned by practice of the invention.

To achieve the above aspects and advantages, there is provided a differential and quadrature harmonic voltage controlled oscillator (VCO) including: a first oscillation unit for generating a first and a third signal; a first combining unit for combining the first and the third signal; a second oscillation unit for generating a second and a fourth signal; and a second combining unit for combining the second and the fourth signal, wherein the phase of the second signal is determined through a phase-invert and delay using the first signal; the phase of the third signal is determined through a phase-invert and delay using the second signal; the phase of the fourth signal is determined through a phase-invert and delay using the third signal; and the phase of the first signal is determined through a phase-invert and delay using the fourth signal.

The VCO may further include: a first detection unit for detecting a first harmonic of the first, the second, the third, and the fourth signal, respectively; and a second detection unit for detecting a second harmonic of the first and the second combining unit, respectively.

The first harmonics of the first and third signals may be differential signals, the first harmonics of the second and fourth signals may be differential signals, and the first harmonics of the first and second signals may be quadrature signals.

The second harmonic signals detected by the first and second combining units may also be differential signals.

The first and the second oscillator may respectively include a tank circuit composed of at least one inductor and at least two variable capacitors.

The first combining unit may further include a node where the first and third signals are combined, and a resistance connected to ground; and the second combining unit may include a node where the second and fourth signals are combined, and a resistance connected to ground.

The frequency of the first, the second, the third, and the fourth signal may vary, according to the change in tuning voltage.

The first oscillation unit may include: a first transistor having a source connected to ground; a second transistor having a drain connected to a gate of the first transistor, a gate connected to a drain of the first transistor, and a source commonly connected to the source of the first transistor and to ground; a fifth transistor having a drain connected to the drain of the first transistor; and a sixth transistor having a drain connected to the drain of the second transistor; and wherein the second oscillation unit may include: a third transistor having a source connected to ground; a fourth transistor having a drain connected to a gate of the third transistor, a gate connected to a drain of the third transistor, and a source commonly connected to the source of the third transistor and to ground; a seventh transistor having a drain connected to the drain of the third transistor; and an eighth transistor having a drain connected to a drain of the fourth transistor, wherein a gate of the seventh transistor is connected to the drain of the first transistor, the drain of the third transistor is connected to the gate of the sixth transistor, a gate of the eighth transistor is connected to the drain of the second transistor, and the drain of the fourth transistor is connected to a gate of the fifth transistor.

The first through eighth transistors may be NMOS transistors.

The first combining unit may include a first resistance, having one end of the first resistance commonly connected to the source of the fifth transistor and the source of the sixth transistor and the other end connected to ground; and the second combining unit may include a second resistance, having one end of the second resistance commonly connected to the source of the seventh transistor and the source of the eighth transistor and the other end connected to ground.

The first oscillation unit may include: a first inductor, having one end connected to the drain of the first transistor and the other end connected to the drain of the second transistor; a first voltage; a first capacitor, having one end connected to one end of the first inductor and the other end connected to the first voltage; a second capacitor, having one end commonly connected to the other end of the first capacitor and the first voltage, and the other end connected to the other end of the first inductor; a second voltage; a ninth transistor, having a drain connected to one end of the first capacitor, and a source connected to the second voltage; and a tenth transistor, having a source connected to the second voltage, and a drain connected to the other end of the second capacitor, and a gate connected to a drain of the ninth transistor; and wherein the second oscillation unit may include: a second inductor, having one end connected to the drain of the third transistor and the other end connected to the drain of the fourth transistor; a third voltage; a third capacitor, having one end connected to one end of the second inductor and the other end connected to the third voltage; a fourth capacitor, having one end commonly connected to the other end of the third capacitor and the third voltage, and the other end connected to the other end of the second inductor; a fourth voltage; an eleventh transistor, having a drain connected to one end of the third capacitor, and a source connected to the fourth voltage; and a twelfth transistor, having a source connected to the fourth voltage, and a drain connected to the other end of the fourth capacitor, and a gate connected to a drain of the eleventh transistor.

The first to eighth transistors may be NMOS transistors, and the ninth to twelfth transistors may be PMOS transistors.

The first, the second, the third, and the fourth capacitor may also be variable capacitors.

The second and the fourth voltage may be 1.8V, and the first and the third voltage may be variable voltages.

The VCO may further include: a first detection circuit connected to one end of the first capacitor for detecting a first harmonic of the first signal; a second detection circuit connected to one end of the third capacitor for detecting a first harmonic of the second signal; a third detection circuit connected to the other end of the second capacitor for detecting a first harmonic of the third signal; a fourth detection circuit connected to the other end of the second capacitor for detecting a first harmonic of the fourth signal; a fifth detection circuit connected to one end of the first resistance for detecting a second harmonic of the fifth signal; and a sixth detection circuit connected to one end of the second resistance for detecting a second harmonic of the sixth signal.

The first to fourth detection circuits may also respectively include: a resistance having one end connected to ground; a capacitor, having one end connected to the other end of the resistance and the other end connected to ground; and a buffer having one end connected to one end of the capacitor; and, wherein the fifth and sixth detection circuits respectively include: a capacitor having one end connected to ground.

The first harmonics of the first and third signals may be differential signals, the first harmonics of the first and fourth signals may be quadrature signals, and the second harmonics of the fifth and sixth signals may be differential signals.

Another aspect of the present invention provides a method for generating a differential and quadrature harmonic signal, the method including: generating a first RF signal; receiving and delaying the first RF signal for a designated time and thereby, generating a second RF signal; receiving and delaying the second RF signal for a designated time and thereby, generating a third RF signal; receiving and delaying the third RF signal for a designated time and thereby, generating a fourth RF signal; and receiving and delaying the fourth RF signal for a designated time and thereby, generating the first RF signal.

The method may further include: combining the first and the third RF signal to generate a fifth RF signal therefrom, and combining the second and the fourth RF signal to generate a sixth RF signal therefrom.

The phase difference of the first, the second, the third, and the fourth RF signal may be 90°, respectively.

The method may further include: detecting a first harmonic signal of the first, the second, the third, and the fourth RF signal.

The method may further include: detecting a second harmonic signal of the fifth and the sixth RF signal.

The method may further include: detecting a first harmonic signal of the first, the second, the third, and the fourth RF signal, respectively, and detecting a second harmonic signal of the fifth and the sixth RF signal, respectively.

Still another aspect of the present invention provides a down-conversion method using a voltage controlled oscillator, the method including: generating a first RF signal from the voltage controlled oscillator; receiving and delaying the first RF signal for a designated time and thereby, generating a second RF signal; receiving and delaying the second RF signal for a designated time and thereby, generating a third RF signal; receiving and delaying the third RF signal for a designated time and thereby, generating a fourth RF signal; receiving and delaying the fourth RF signal for a designated time and thereby, generating the first RF signal; combining the first and the third RF signal to generate a fifth RF signal, and combining the second and fourth RF signal to generate a sixth RF signal; detecting a first harmonic signal of the first, the second, the third, and the fourth RF signal, respectively, and detecting a second harmonic signal of the fifth and the sixth RF signal; and performing a primary down-conversion using the second harmonic signal, and performing a secondary down-conversion using the first harmonic signal.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
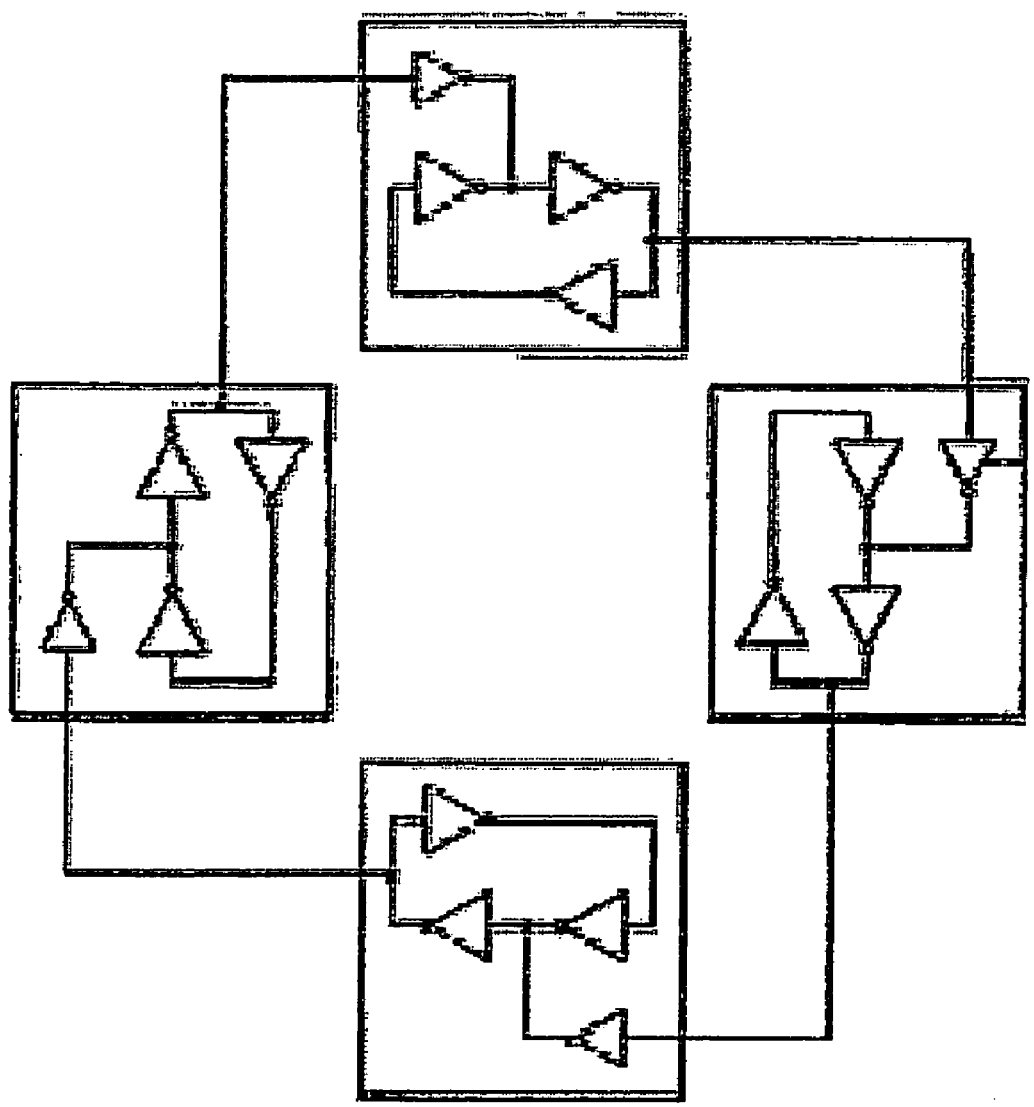
FIG. 1 illustrates a multiphase output oscillator using a logic inverter gate.
Figure 2:
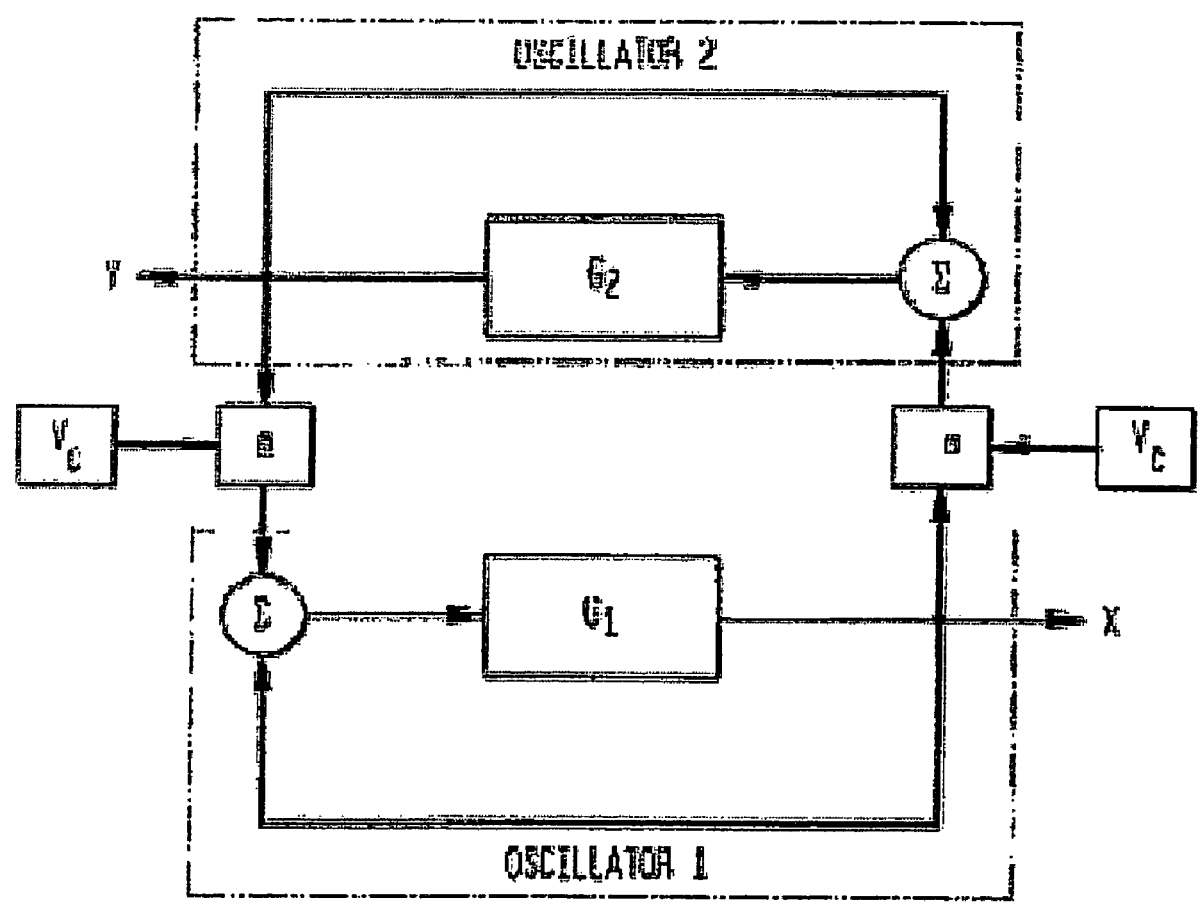
FIG. 2 illustrates two fixed-frequency oscillators coupled in a ring topology.
Figure 3A:
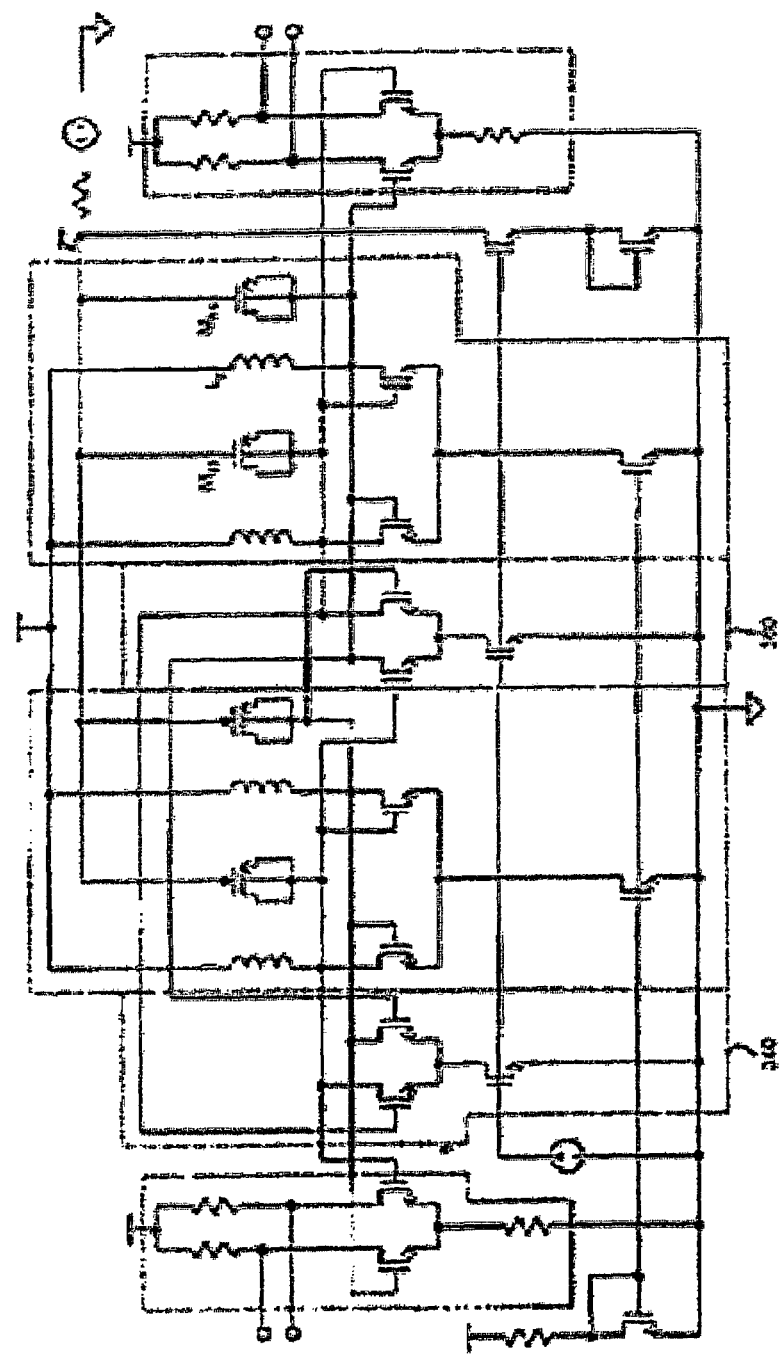
FIG. 3A illustrates a related art wide-band/multi-band voltage controlled oscillator.
Figure 3B:
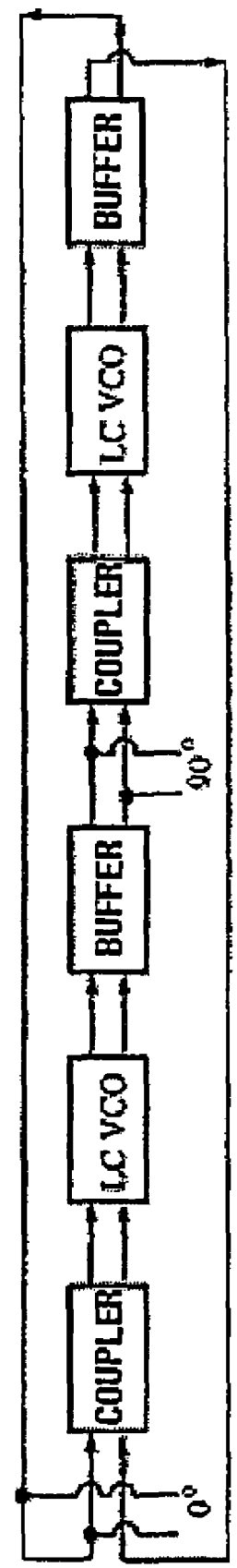
FIG. 3B illustrates coupling for an LC-based VCO.

Reference will now be made in detail to the embodiments of the present invention, examples of which are illustrated in the accompanying drawings, wherein like reference numerals refer to the like elements throughout. The embodiments are described below to explain the present invention by referring to the figures.

Embodiments of the present invention relate to a monolithically integrated frequency multiplier VCO circuit in CMOS technology, generating quadrature differential phase output signals at a first harmonic, and differential phase output signals at a second harmonic. All the signals are generated at the same time, and can be detected by different output nodes. Most of the signals are decoupled from each other. Preferably, the VCO circuit may be implemented in 0.18 μm CMOS technology, though not limited thereto. Te VCO circuit includes an NMOS transistor, a PMOS transistor, an NMOS varactor diode, a spiral inductor, and an MIM capacitor. This circuit configuration is not limited to the CMOS, and can be easily transformed during a bipolar or a heterobipolar process.

Figure 4:
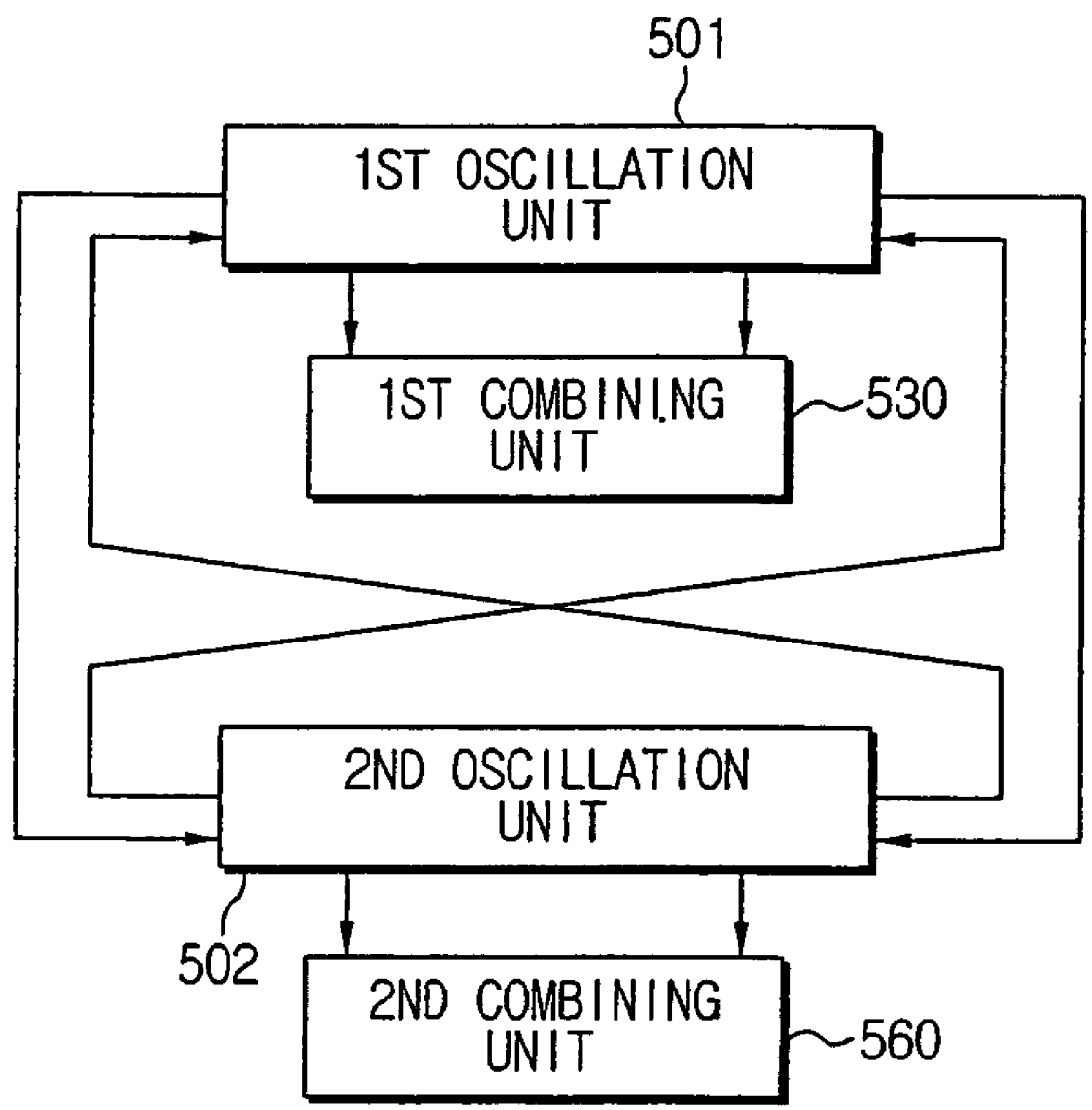
FIG. 4 illustrates a VCO, according to an embodiment of the present invention.

FIG. 4 is a schematic diagram of a VCO, according to an embodiment of the present invention.

As shown in FIG. 4, the VCO includes a first oscillation unit 501, a second oscillation unit 502, a first combining unit 530, and a second combining unit 540.

The first oscillation unit 501 generates a first and a third signal, and the second oscillation unit 502 generates a second and a fourth signal.

The phase of the second signal is determined through a phase-invert and delay using the first signal, the phase of the third signal is determined through a phase-invert and delay using the second signal, the phase of the fourth signal is determined through a phase-invert and delay using the third signal, and the phase of the first signal is determined through phase-invert and delay using the fourth signal.

The first combining unit 530 combines the first signal and the third signal, while the second combining unit 560 combines the second signal and the fourth signal.

A first harmonic of the first, second, third and fourth signals is detected through a first detection unit (not shown), respectively, and a second harmonic of the first and second combining units is detected through a second detection unit (not shown), respectively.

The first harmonics of the first and third signals may be differential signals, and the first harmonics of the second and fourth signals may be differential signals. Meanwhile, the first harmonics of the first and fourth signals may be quadrature signals, and the second harmonics of the first and second combining units may be differential signals.

Figure 5A:
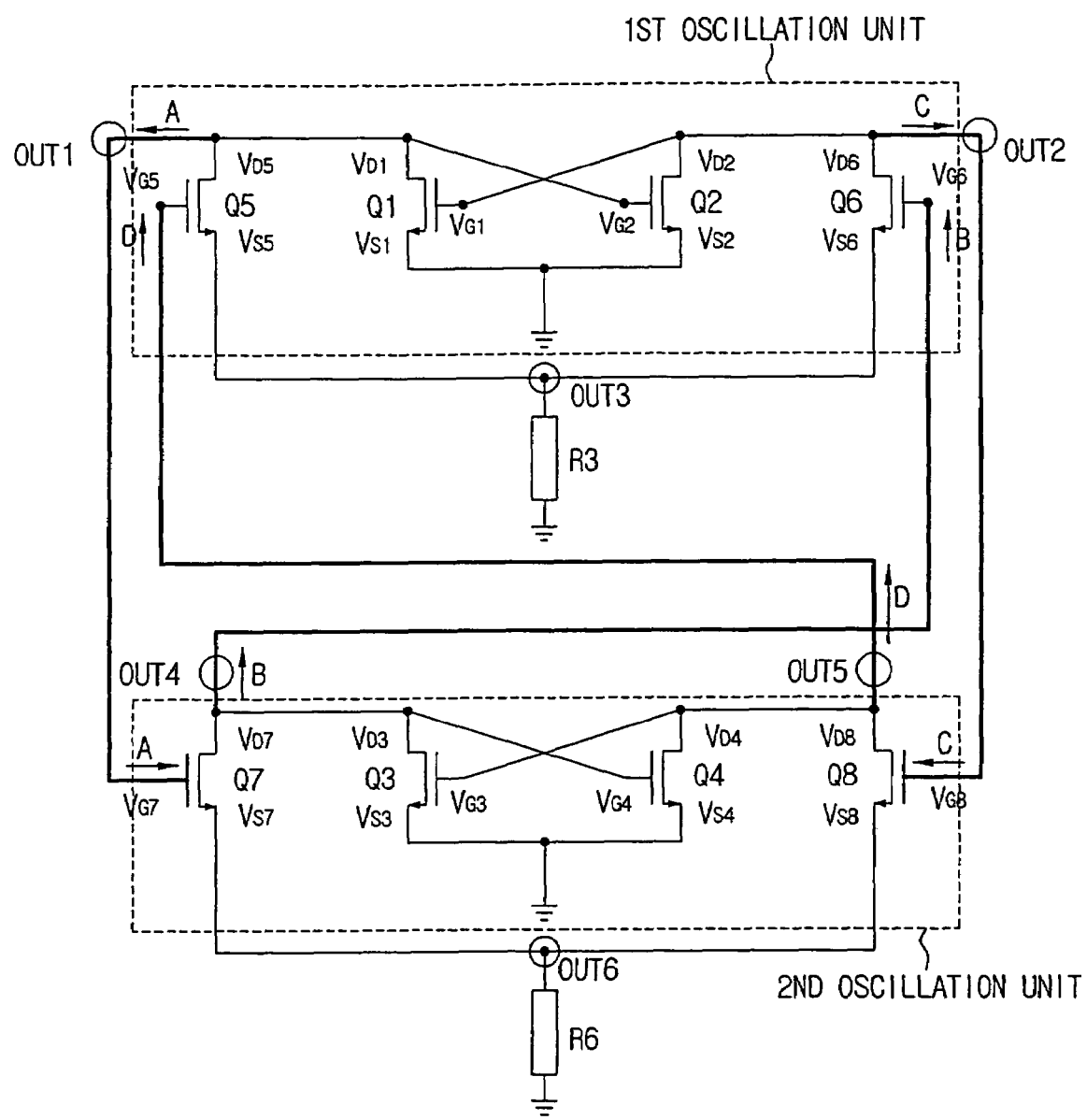
FIG. 5A is a schematic diagram of a VCO. according to an embodiment of the present invention.

FIG. 5A is a schematic diagram of a VCO, according to an embodiment of the present invention.

Referring to FIG. 5A, the VCO includes two oscillation units, the first and the second oscillation unit. In the interests of simplicity, a tank circuit and a voltage supply are not shown in the VCO circuit of FIG. 5A. The first oscillation unit includes four NMOS transistors, Q1, Q2, Q5, and Q6. The second oscillation unit also includes four NMOS transistors, Q3, Q4, Q7, and Q8. The first NMOS transistor Q1 has a gate connected to a drain of the second NMOS transistor Q2. The first NMOS transistor Q1 has a drain connected to a gate of the second NMOS transistor Q2 and a drain of the fifth NMOS transistor Q5. A source of the first NMOS transistor Q1 is commonly connected to a source of the second NMOS transistor Q2 and to ground.

The drain of the second NMOS transistor Q2 is connected to the gate of the first NMOS transistor Q1 and a drain of the sixth NMOS transistor Q6.

A gate of the fifth NMOS transistor Q5 is coupled to a fifth output OUT5. A source of the fifth NMOS transistor Q5 is commonly connected to a source of the sixth NMOS transistor Q6, and is connected to ground through a resistance R3.

A gate of the sixth NMOS transistor Q6 is coupled to a fourth output OUT4.

A first output OUT1 is obtained from a node between the drain of the first NMOS transistor Q1 and the drain of the fifth NMOS transistor Q5. A second output OUT2 is obtained from a node between the drain of the second NMOS transistor Q2 and the drain of the sixth NMOS transistor Q6. A third output OUT3 is obtained from a common node of the source of the fifth NMOS transistor Q5 and the source of the sixth NMOS transistor Q6.

The second oscillation unit has the corresponding configuration with the first oscillation unit, so the same constituent elements will not be described here.

A gate of the seventh NMOS transistor Q7 is connected to the first output OUT1 of the first oscillation unit. A drain of the seventh NMOS transistor Q7 is connected to the gate of the sixth NMOS transistor Q6 of the first oscillation unit, and to a drain of the third NMOS transistor Q3, respectively.

A gate of the eighth NMOS transistor Q8 is connected to the second output OUT2 of the first oscillation unit. A drain of the eighth NMOS transistor Q8 is connected to the gate of the fifth NMOS transistor Q5, and to a drain of the fourth NMOS transistor Q4, respectively.

A fourth output OUT4 is obtained from a node between the drain of the third NMOS transistor Q3 and the drain of the seventh NMOS transistor Q7. A fifth output OUT5 is obtained from a node between the drain of the fourth NMOS transistor Q4 and the drain of the eighth NMOS transistor Q8. A sixth output OUT6 is obtained from a node between a source of the seventh NMOS transistor Q7 and a source of the eighth NMOS transistor Q8.

Referring again to FIG. 5A, the connection between the two oscillation units is indicated by bold lines. The operational principles of the oscillator generating both quadrature and differential signals will be explained with reference to the circuit structure shown in FIG. 5A.

Each of the first to fourth outputs OUT1 to OUT4 includes harmonics.

In this particular embodiment, only an RF signal is considered and it is assumed that the circuit is biased.

As shown in FIG. 5A, it is assumed that a signal A having a designated phase and frequency is output by the first output port OUT1. When the signal A is input to the gate of the seventh NMOS transistor Q7, a signal B is generated at the drain of the seventh NMOS transistor Q7. Compared to the signal A, the signal B is a phase inverted and delayed. The signal B is output by the fourth output OUT4.

When the signal B is input to the gate of the sixth NMOS transistor Q6, a signal C is generated at the drain of the sixth NMOS transistor Q6. Compared to the signal B, the signal C is phase inverted and delayed. The signal C is output by the second output OUT2.

When the signal C is input to the gate of the eighth NMOS transistor Q8, a signal D is generated at the drain of the eighth NMOS transistor Q8. Compared to the signal C, the signal D is phase inverted and delayed. The signal D is output by the second output OUT5.

When the signal D is input to the gate of the fifth NMOS transistor Q5, the signal A is generated at the drain of the fifth NMOS transistor Q5. Compared to the signal D, the signal A is phase inverted and delayed. The signal A is output by the first output OUT1.

Phase angles at each voltage (hereinafter, each phase angle is referred to arg(V)) in FIG. 5A have the following relations.

$$arg(VG1)=arg(VD2)=arg(VD6)=arg(VG8) \quad (1)$$

$$arg(VG2)=arg(VD1)=arg(VD5)=arg(VG7) \quad (2)$$

$$arg(VG3)=arg(VD4)=arg(VD8)=arg(VG5) \quad (3)$$

$$arg(VG4)=arg(VD3)=arg(VD7)=arg(VG6) \quad (4)$$

The phase angles at 8 source voltages are zero (0), and this zero phase is a reference phase (ground).

$$arg(VS1)=arg(VS2)=arg(VS3)=arg(VS4)=0 \quad (5)$$

Because of the cross-coupling state between output ports, the following equations are derived with respect to the first harmonic.

$$arg(VD1)=arg(VG1)-180° \quad (6)$$

$$arg(VD2)=arg(VG2)+180° \quad (7)$$

The Equations (6) and (7) represent a steady-state of the oscillator. This state is present in the oscillator, if the well-known Barkhausen criterion is fulfilled.

The following relations can be derived from the Equation (1).

$$arg(VD2)=arg(VG1) \quad (8)$$

$$arg(VD1)=arg(VG1)-180°=arg(VD2)-180° \quad (9)$$

As shown in the equations, the phase difference between the first output port and the second output port is 180 degrees.

The phase difference between the fourth and the fifth output port and between the first and the second output port is 180°, respectively. This means that the first harmonic of the two oscillators is a differential signal.

Two Coupled Oscillators

If two oscillators are coupled to each other, the following conditions are met.

$$arg(VD7)=arg(VG6) \quad (10)$$

$$arg(VD8)=arg(VG5) \quad (11)$$

$$\arg(VG7)=\arg(VD5) \quad (12)$$

$$\arg(VG8)=\arg(VD6) \quad (13)$$

Since the two oscillators are coupled to each other, the phase differences between the drains and the gates of those 8 NMOS transistors in FIG. 5A are as follows:

$$\arg(VD1)-\arg(VG1)=-180° \quad (14)$$

$$\arg(VD2)-\arg(VG2)=180° \quad (15)$$

$$\arg(VD3)-\arg(VG3)=180° \quad (16)$$

$$\arg(VD4)-\arg(VG4)=-180° \quad (17)$$

$$\arg(VD5)-\arg(VG5)=-90° \quad (18)$$

$$\arg(VD6)-\arg(VG6)=-90° \quad (19)$$

$$\arg(VD7)-\arg(VG7)=-90° \quad (20)$$

$$\arg(VD8)-\arg(VG8)=-90° \quad (21)$$

The phase difference between the 'first output port' and the 'fourth output port' can be obtained as follows:

$$\arg(VD1)=\arg(VD5)=\arg(VG5)-90°=\arg(VD8)-90°=\arg(VD4)-90°=\arg(VG3)-90°=\arg(VD3)+180°-90°=\arg(VD3)+90° \quad (22)$$

In similar way, the phase difference between the 'second output port' and the 'fifth output port' can be obtained as follows:

$$\arg(VD2)=\arg(VD6)=\arg(VG6)-90°=\arg(VD7)-90°=\arg(VD3)-90°=\arg(VG3)+180°-90°=\arg(VG3)+90°=\arg(VD4)+90° \quad (23)$$

By simplifying the Equations (22) and (23), the following are obtained.

$$\arg(VD1)-\arg(VD3)=90° \quad (24)$$

$$\arg(VD2)-\arg(VD4)=90° \quad (25)$$

Therefore, the two coupled oscillators generate the first harmonic having a quadrature (refer to the Equations (24) and (25)) and differential (refer to Equation (9)) phase.

Phase characteristics of the second harmonic generated by the two coupled oscillators will be now explained.

Typically in a differential oscillator, odd numbered harmonics (1st, 3rd, 5th, . . . ) are differential (i.e., the phase difference between two outputs is 180 degrees), and even numbered harmonics (2nd, 4th, 6th, . . . ) are in phase (i.e., the phase difference is 0 degree). These are because Q1 and Q2 are cross-coupled to each other. In general, the first harmonic is the first thing to consider in a circuit design. A circuit can be designed in such a manner that two outputs have a 180 degree phase difference. An oscillator with the above circuit is called a differential oscillator.

Generally, all signals are either even mode or odd mode signals (it should be noted that the odd mode is not the same as an odd numbered harmonic). The first harmonic signals are mostly in the odd mode, with the even mode being cancelled. As a result of this, there is a phase difference 180-degrees. In contrary, the second harmonic signals are mostly in the even mode, with the odd mode being cancelled. In such a case, there is zero phase difference.

Referring again to FIG. 5A, the source of the fifth NMOS transistor Q5 (VS5) and the source of the sixth NMOS transistor Q6 (VS6) are interconnected to each other and with one end of a resistance R3, with other end of resistance R3 being connected to ground. The source of the seventh NMOS transistor Q7 (VS7) and the source of the eighth NMOS transistor Q8 (VS8) are connected likewise, through resistance R6.

Therefore, signals on both paths are combined. As shown in the Equation (9), the first harmonic signals are differential, and the second harmonic signals are in-phase. Therefore, when the first harmonic (or each odd numbered harmonic) is combined, it is cancelled (i.e., it has an extremely small magnitude in the actual circuit). While when the second harmonic (or even numbered harmonic) is combined, the signal strength is multiplied twice (in-phase). Thus, the signals at the 'third output port' are made up of a strong second harmonic and a weak first harmonic. There are other harmonics as well, but their magnitudes are so small that they can be ignored.

Being connected in the same manner, a signal at the 'sixth output port' has a different phase. From the Equations (14) to (17), it is found that the phase difference is 180°.

Differential second harmonic signals exist between the 'third output port' and the 'sixth output port'. They are generated by combining harmonic signals.

Figure 5B:
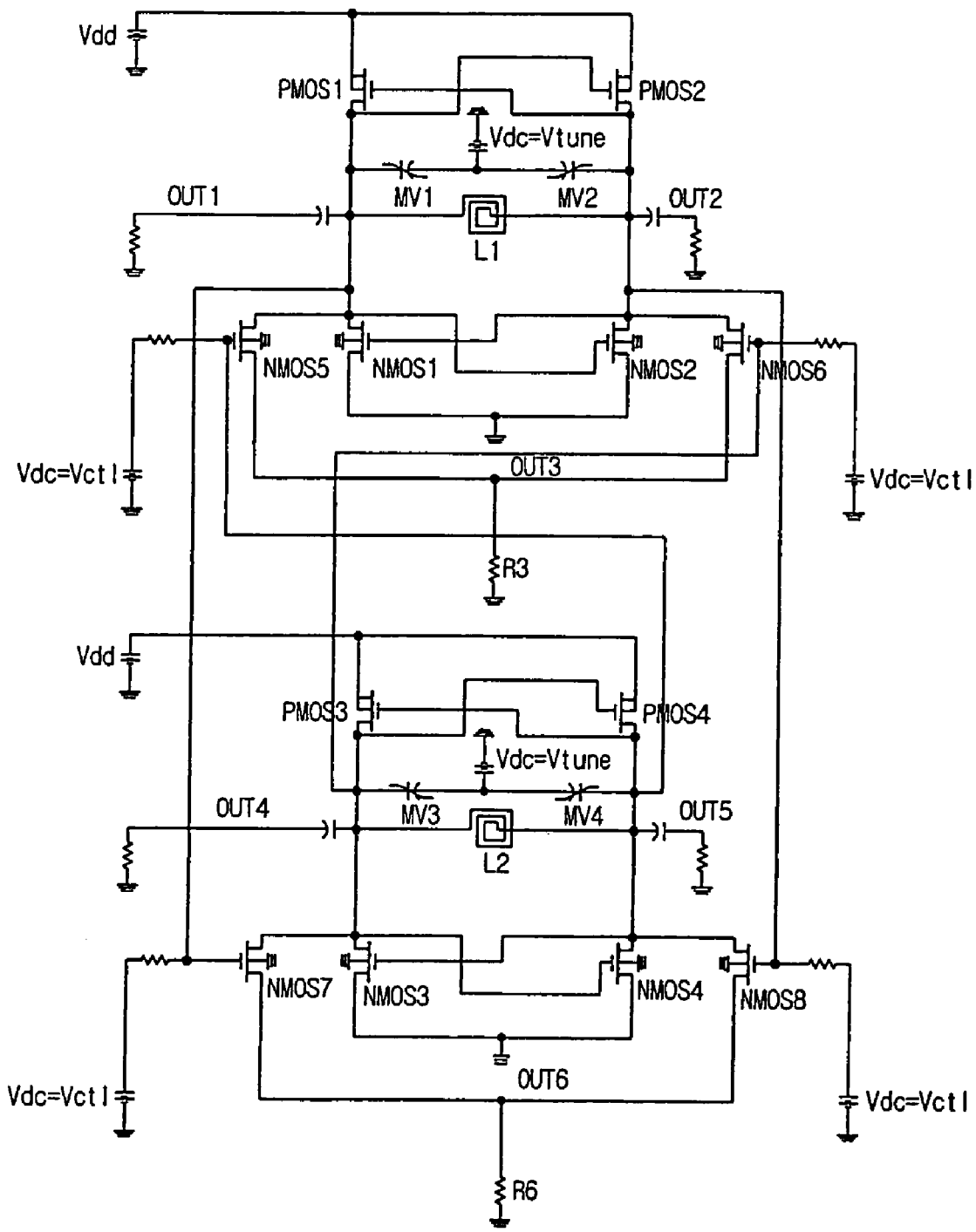
FIG. 5B illustrates a VCO circuit diagram in which a VCO of FIG. 5A is applied, according to another embodiment of the present invention.

FIG. 5B is another embodiment of the present invention, illustrating a VCO circuit diagram to which the VCO of FIG. 5A can be applied.

The VCO of FIG. 5A can be applied to the VCO circuit shown in FIG. 5B. That is, there are two oscillators, with transistors of the upper and the lower oscillator being connected to each other in a one-to-one correspondence.

Referring to the upper oscillator, two PMOS transistors are symmetrically interconnected. A source of a first PMOS transistor (PMOS1) is connected to a second voltage Vdd. A gate of the first PMOS transistor is connected to a drain of a second PMOS transistor (PMOS2). A drain of the first PMOS transistor is connected respectively to a gate of the second PMOS transistor (PMOS2), one end of a first variable capacitor (that is, a varactor diode) MV1, one end of a first inductor, a drain of a first NMOS transistor (NMOS1), a drain of a fifth NMOS transistor (NMOS5), and a gate of a seventh NMOS transistor (NMOS7).

A source of the second PMOS transistor (PMOS2) is connected to the second voltage Vdd. The gate of the second PMOS transistor is connected to the drain of the first PMOS transistor. The drain of the second PMOS transistor is connected respectively to the gate of the first PMOS transistor, one end of a second variable capacitor MV2, the other end of the first inductor L1, a drain of the second NMOS transistor (NMOS2), a drain of a sixth NMOS transistor (NMOS6), and a gate of an eighth NMOS transistor (NMOS8).

The other end of the first variable capacitor MV1 and the other end of the second variable capacitor MV2 are interconnected to each other, and the node therebetween is coupled to a first voltage Vdc=Vtune.

As mentioned before, the lower oscillator in FIG. 5B is connected to the upper oscillator in a one-to-one correspondence, with similar elements illustrated therein, e.g., PMOS3, PMOS4, MV3, MV4, and L2.

The upper and the lower Vdd in FIG. 5B may be identical, the upper and the lower Vdc=Vtune may be identical, and illustrated NMOS3 and NMOS 4 may perform similarly to Q3 and Q4, respectively.

The PMOS transistor functions as an active load for the NMOS transistor, and vice versa.

The MV1, MV2, and L1 provide a resonance circuit (tank circuit).

Figure 5C:
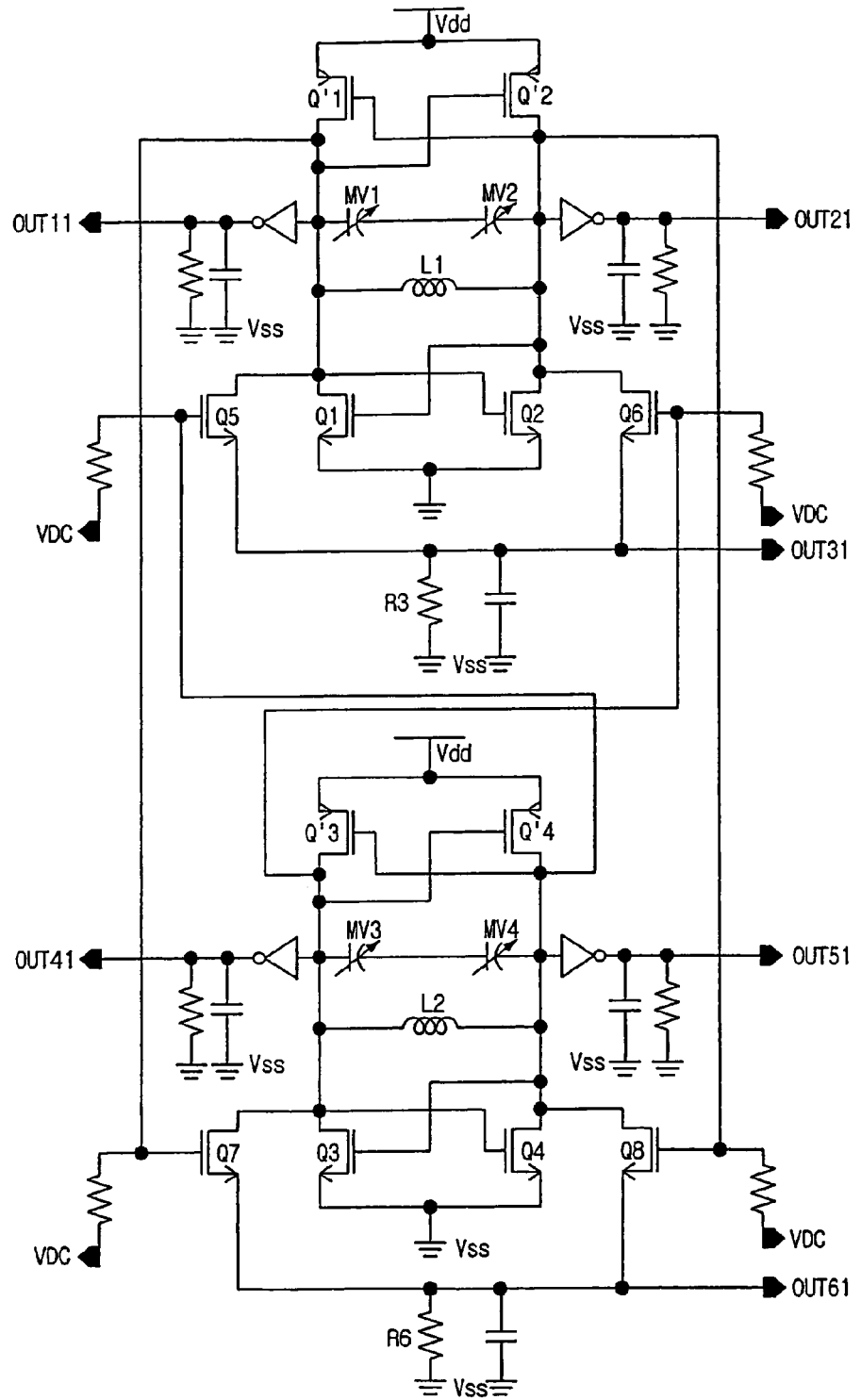
FIG. 5C illustrates a circuit diagram in which a detection circuit is added to the circuit of FIG. 5B, according to an embodiment of the present invention.

FIG. 5C illustrates a circuit diagram in which a detection circuit is added as a constituent element of the circuit of FIG. 5B.

More specifically, the circuit of FIG. 5C has a buffer and a filter circuit additionally connected to the output port of the circuit shown in FIG. 5B.

Q1 to Q8 correspond to the NMOS1 to NMOS8 of FIG. 5B, and Q'1 to Q'4 correspond to PMOS1 to PMOS4 of FIG. 5B.

The first harmonic is detected by OUT11, OUT21, OUT41, and OUT51. The second harmonic is detected by OUT31, and OUT61.

The relations between the frequency of the first harmonic (f_1stHarm), the frequency of the second harmonic (f_2ndHarm), and the frequency of a signal generated at the LC tank circuit (f_Tank) can be expressed as follows:

$$f\_1stHarm = 2pi/sqrt(L*(Cv/2)) = f\_Tank$$

$$f\_2ndHarm = 2*f\_1stHarm = 2*f\_Tank$$

Cv denotes a junction capacitor of the NMOS varactor (it is Cv/2 because MV1 and MV2 have the same value and are serially connected), and L denotes an inductance value of L1.

The frequency of the first harmonic is the same as the frequency of a signal generated at the tank circuit, and the frequency of the second harmonic is twice the frequency of the first harmonic.

By changing the Vtune, it is possible to change the capacitance value (Cv) as well. In this way, frequency adjustment can be made possible.

The signal strength of the second harmonic can be varied by applying another voltage.

Figure 6A:
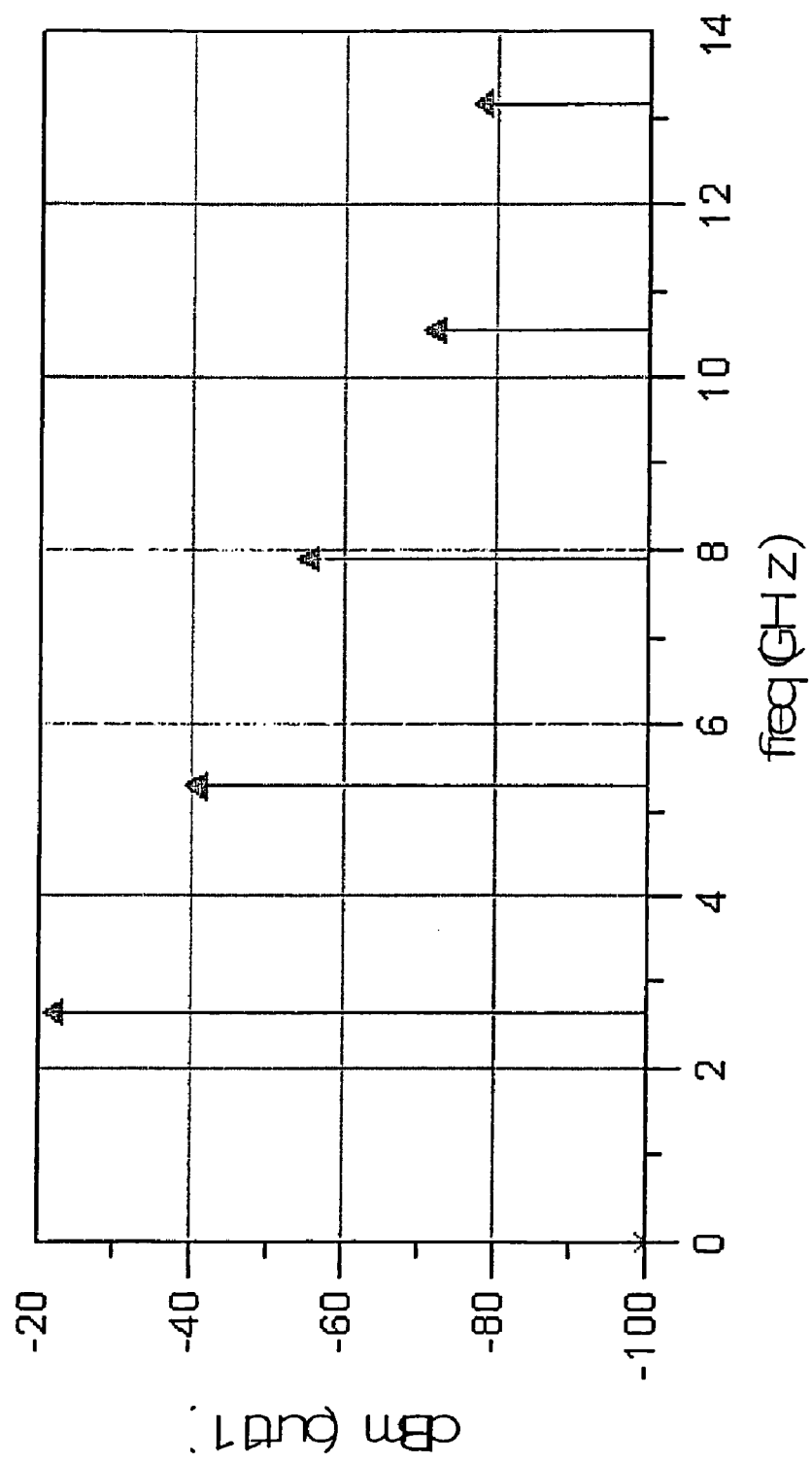
FIGS. 6A and 6B illustrate RF power spectrums of output signals of the circuit illustrated in FIG. 5C.
Figure 6B:
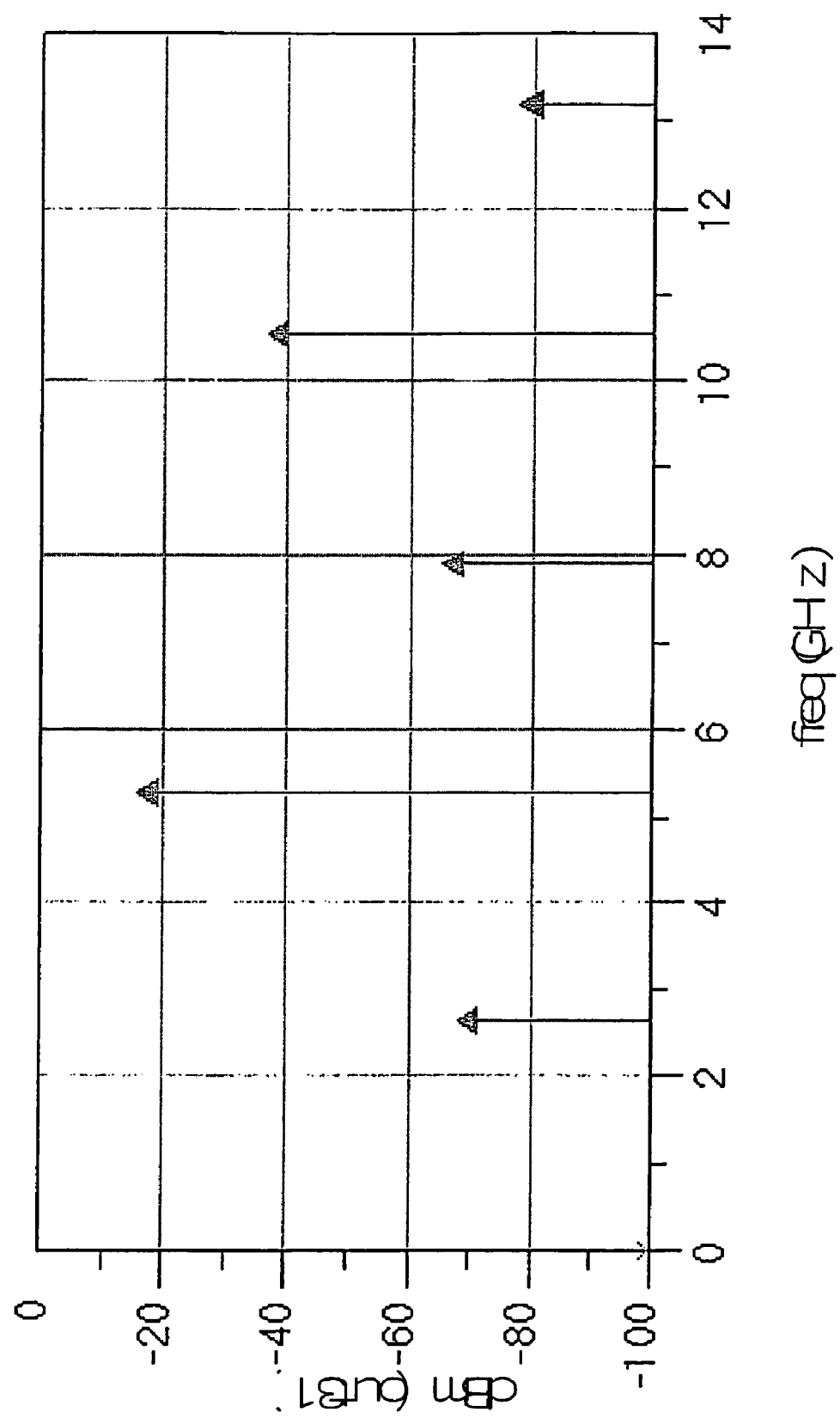

FIGS. 6A and 6B respectively illustrate an RF power spectrum of an output signal of the circuit illustrated in FIG. 5C.

In particular, FIG. 6A illustrates an RF power spectrum output from the OUT11 in the circuit of FIG. 5C. As shown in FIG. 6A, the RF power spectrum of an output signal is gradually decreased, with the RF power spectrum of the first harmonic signal having the greatest value.

FIG. 6B illustrates an RF power spectrum output from the OUT31 in the circuit of FIG. 5C. As shown in FIG. 6B, the RF power spectrum of an output signal is not gradually decreased. In effect, the RF power spectrum of the even harmonic signal is greater than the RF power spectrum of the odd harmonic signal, and the RF power spectrum of the second harmonic signal becomes the greatest.

Figure 7A:
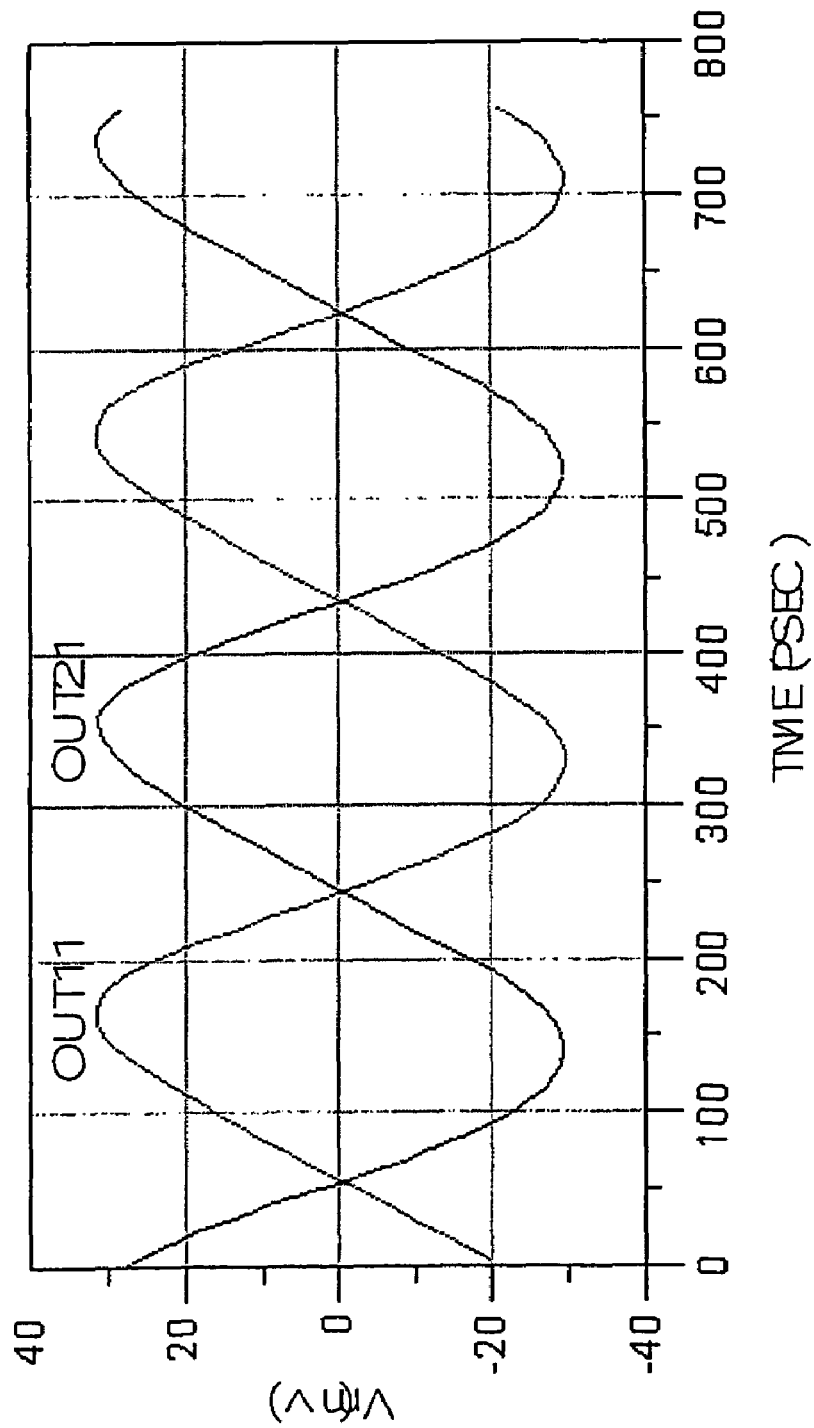
FIGS. 7A to 7C illustrates waveforms of filtered signals in the circuit illustrated in FIG. 5C.
Figure 7B:
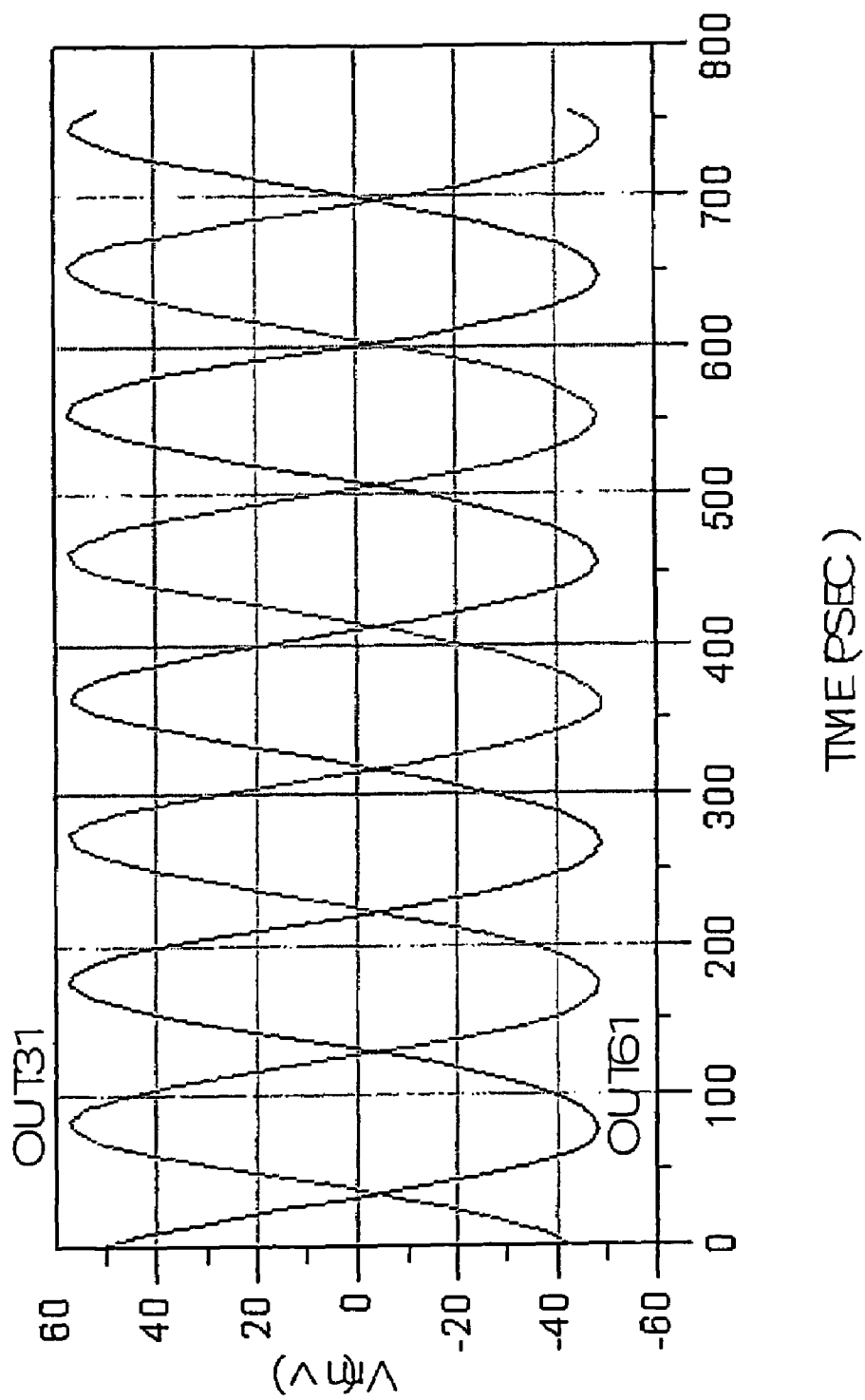
Figure 7C:
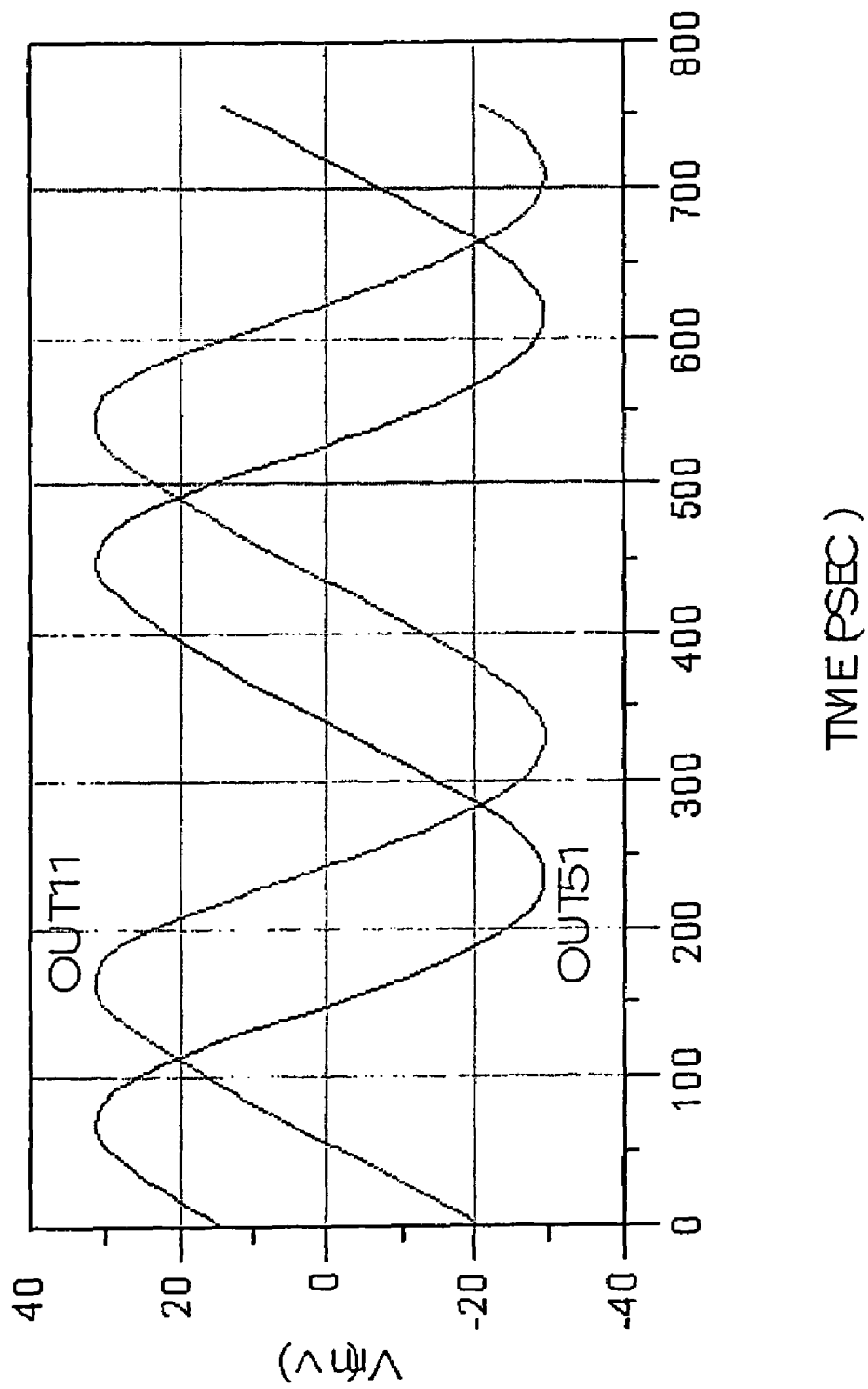

FIGS. 7A to 7C illustrate the waveform of a filtered signal in the circuit illustrated in FIG. 5C.

In particular, FIG. 7A illustrates the waveforms of signals filtered by the OUT11 and OUT21 of the circuit shown in FIG. 5C, respectively. The graph shows the waveform of the first harmonic differential signal. As shown in FIG. 7A, there is a 180-degree phase difference between the filtered signals by the OUT11 and OUT21.

FIG. 7B illustrates the waveforms of signals filtered by the OUT31 and OUT61 of the circuit shown in FIG. 5C, respectively. The graph shows the waveform of the second harmonic differential signal. As shown in FIG. 7B, there is a 180-degree phase difference between the filtered signals by the OUT31 and OUT61.

FIG. 7C illustrates the waveforms of signals filtered by the OUT11 and OUT51 of the circuit shown in FIG. 5C, respectively. The graph shows the waveform of the first harmonic quadrature signal. As shown in the FIG. 7C, there is a 90-degree phase difference between the filtered signals by the OUT11 and OUT51.

Figure 8:
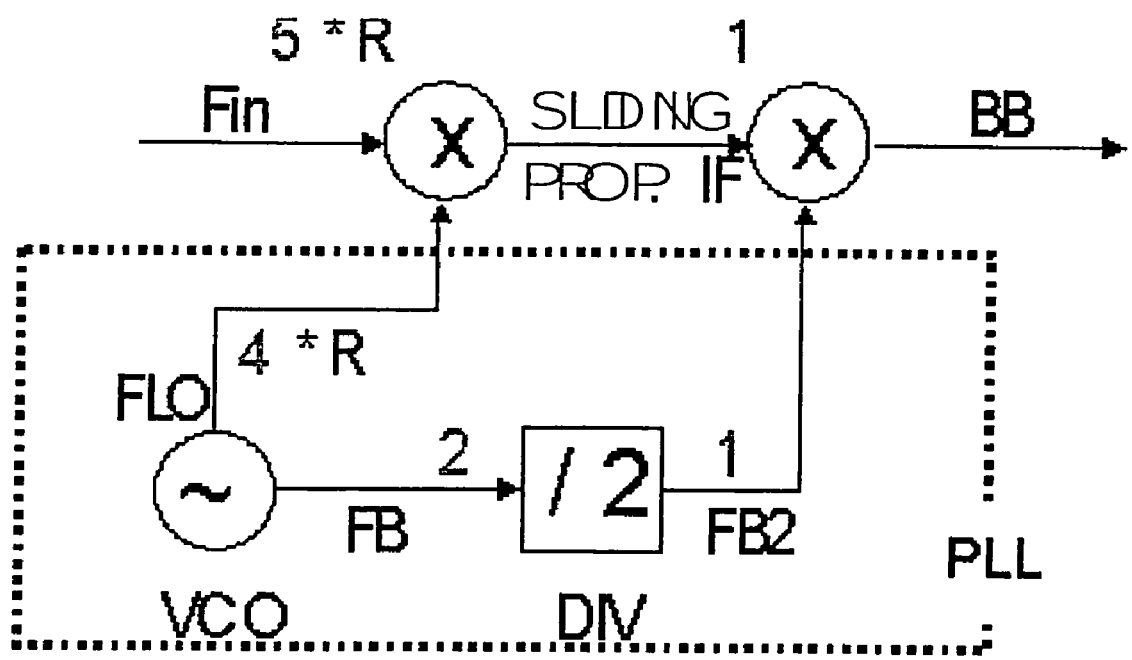
FIG. 8 is a schematic diagram of a wireless receiver using a VCO, according to an embodiment of the present invention.

FIG. 8 is a schematic diagram of a wireless receiver using the VCO of the present invention.

More specifically, FIG. 8 is a schematic diagram of a wireless receiver using two-step down conversion with a sliding proportional IF. Here, VCO denotes the voltage controlled oscillator according to an embodiment of the present invention.

To determine the IF (Intermediate Frequency), the following conditions should be satisfied.
1) Fin−FLO=IF
2) FLO/4=IF
Therefore, IF=Fin/5.

Fin is a radio frequency (hereinafter, it is referred to as 'RF'), and is down-converted to a baseband signal (hereinafter, it is referred to as 'BB'). FLO is a second harmonic signal, and FB is a first harmonic signal, each being generated by the VCO. FB2 is an output from the DIV, and its frequency is half of the FB frequency. If a tuning voltage Vtune changes, a variable R varies with respect to the FB and the FLO frequency.

For example, suppose the following conditions:
1) Input frequency Fin=5 GHz.
2) R=1. Through this, the VCO is adjusted to realize FB=2 GHz for the first harmonic, with FLO=4 GHz for the second harmonic.
3) FB2=1 GHz (because of the operation of the DIV).

Analysis of a mixing procedure is now described in the following:

Operation I

Fin is mixed with FLO. If the magnitude of the FLO is much greater than that of the Fin, which is generally true, the mixing result is as follows.

$$Fin-FLO, Fin+FLO, 2*Fin-FLO, 2*Fin+FLO, \ldots, n*Fin-FLO, n*Fin+FLO$$

The most important and interesting part of the signals is the first mixing result. It has a Fin−FLO frequency and thus, is called a difference signal. The signal frequency is Fin−FLO=1 GHz. This type of signal has an IF because it is not a final conversion result, but an intermediate result.

Operation II

The difference signal, Fin−FLO, is mixed with the FB2. The frequency of both signals Fin−FLO=FB2=1 GHz. The frequency of the difference signal of the mixing procedure is Fin−FLO−FB2=0, which is a BB. Therefore, the RF-to-BB conversion is not completed until the second conversion operation is conducted.

Supposed that the RF signal (Fin) frequency has changed, the following will be the consequences thereof.

As long as the initial condition IF=Fin/5 is maintained, the VCO frequency can be tuned by using the tuning voltage Vtune, with the RF signal (Fin) frequency undergoing the following change.

Then, the input frequency changes from 5 GHz to 6 GHz, which is a 20% increase with a factor of 1.2.

Supposing the VCO frequency is tuned to a 20% higher frequency, FB=2 GHz*1.2=2.4 GHz and FLO=4 GHz*1.2=4.8 GHz.

As a result, a new IF, Fin−FLO=6 GHz−4.8 GHz=1.2 GHz, showing an increase from 1 GHz to 1.2 GHz.

Therefore, the IF shifts in proportion to the RF input signal Fin.

Figure 9A:
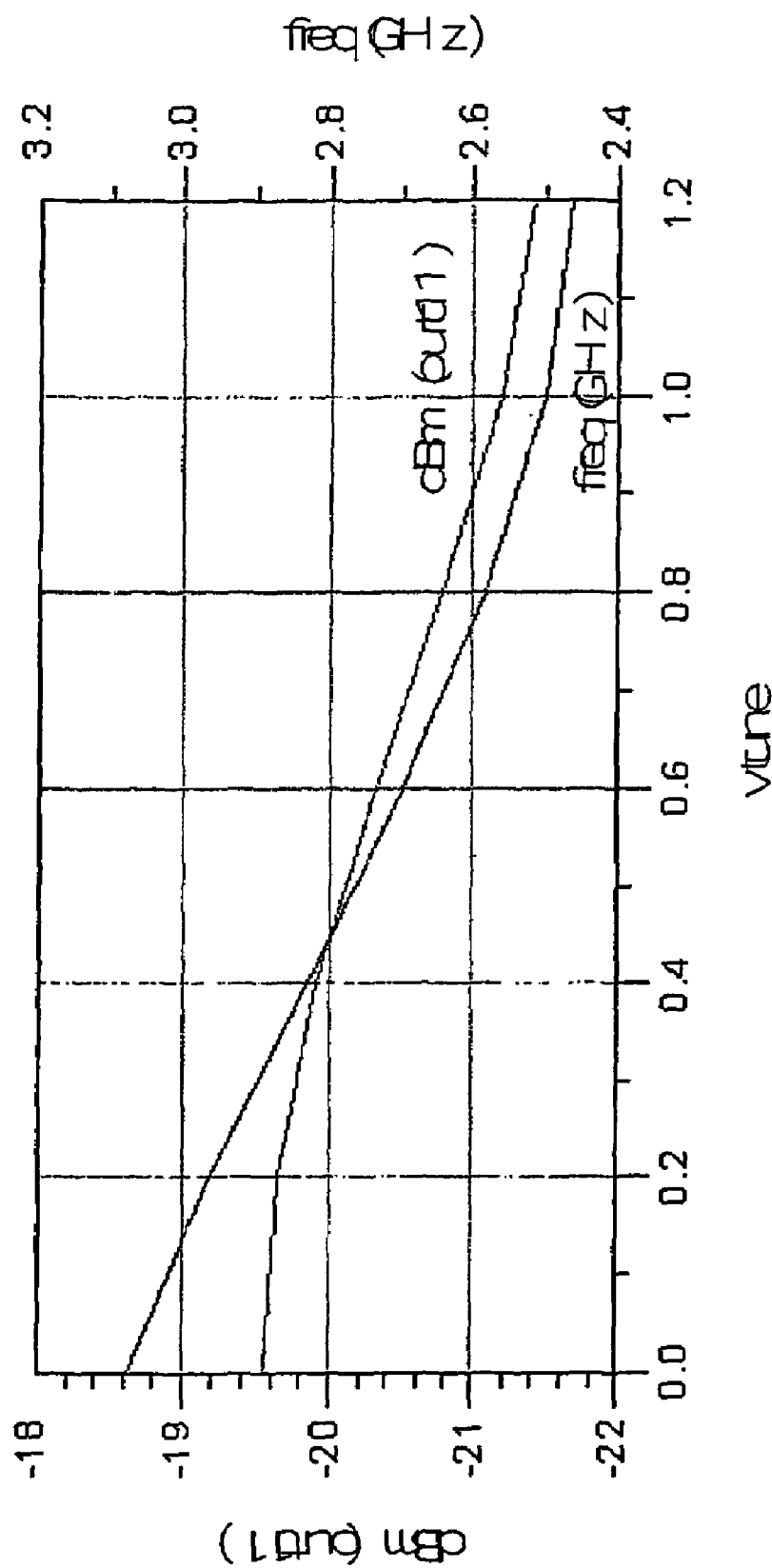
FIGS. 9A and 9B graphically illustrate the relation between tuning range of a first and a second harmonic and the magnitude of a first harmonic and a second harmonic signal.
Figure 9B:
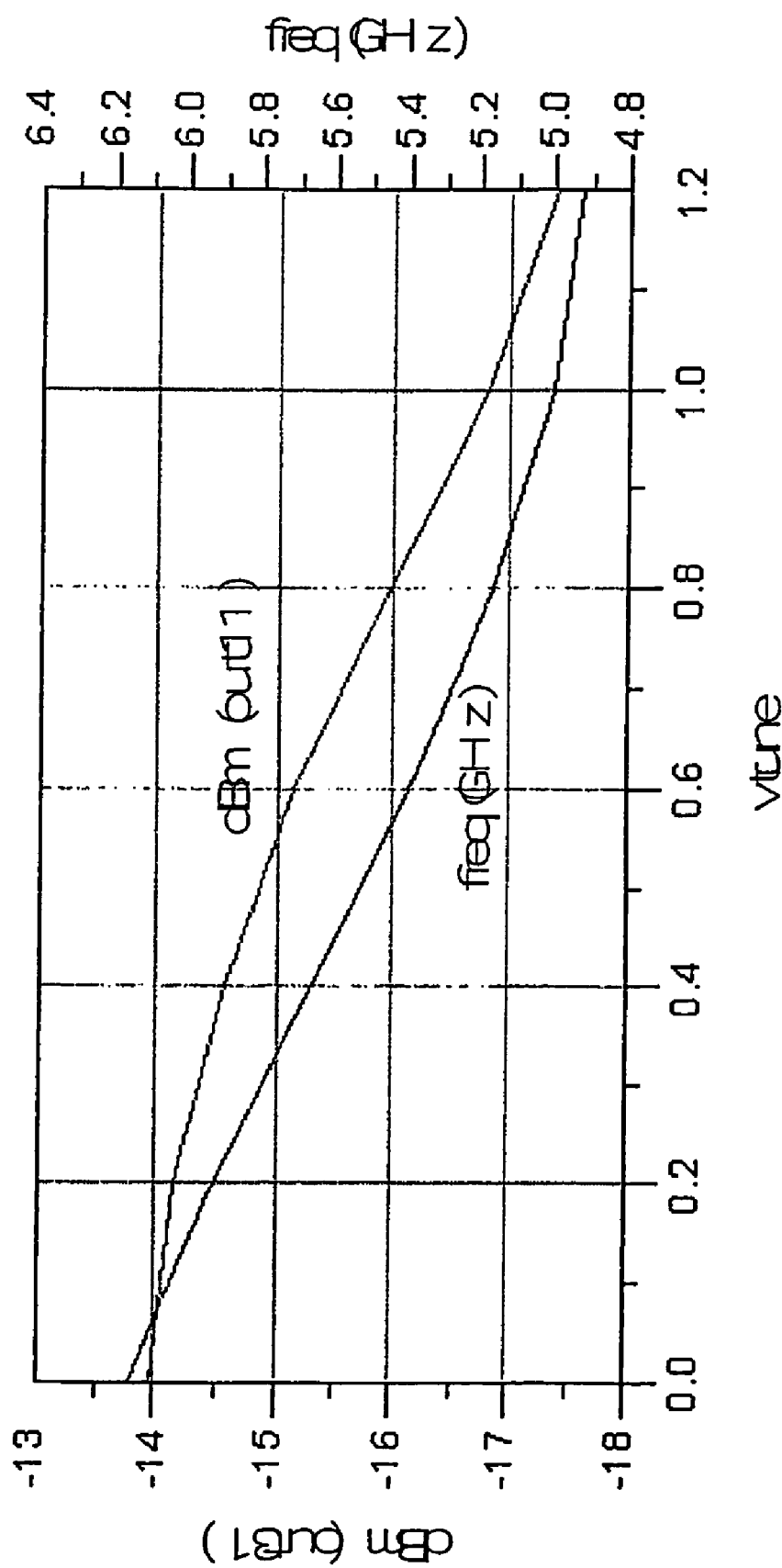

FIGS. 9A and 9B graphically illustrate the relationship between the tuning range of a first and a second harmonic and the magnitude of a first harmonic and a second harmonic signal. Referring to FIG. 9A, the tuning range of the first harmonic with respect to the change in the Vtune is 700 MHz. Referring to FIG. 9B, the tuning range of the second harmonic with respect to the change in the Vtune is 1.4 GHz (2×700 MHz). Thus, the tuning range has increased more than 100%.

Lastly, the chip size is also reduced. This is realized because only two spiral inductors L1, L2 are needed to construct the tank circuit. Considering that the spiral inductor in a single IC requiring as much chip space as possible, the reduction of size and manufacture costs are important.

Figure 10:
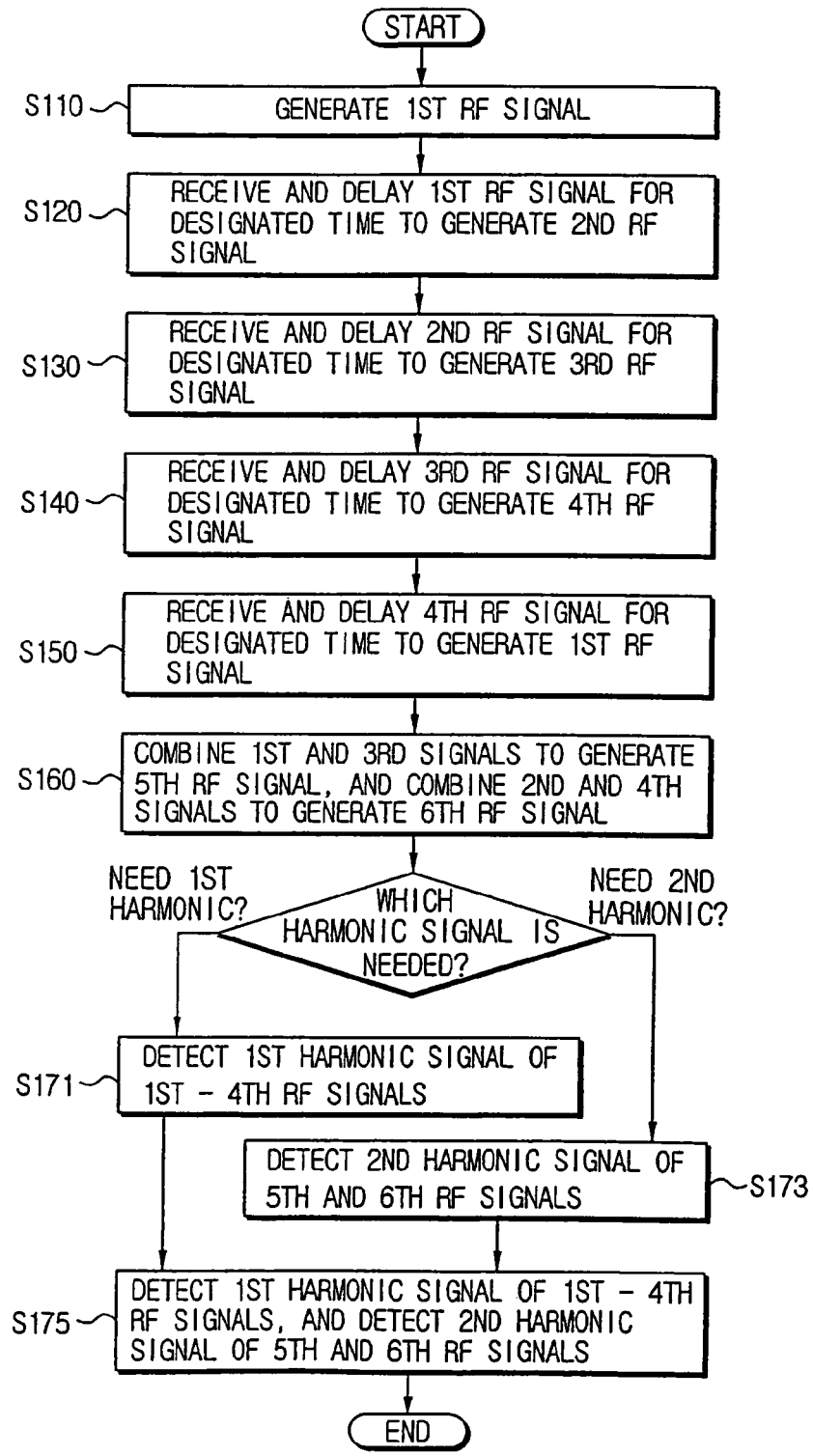
FIG. 10 is a flowchart describing a method for generating differential and quadrature harmonic signals using a VCO, according to an embodiment of the present invention.

FIG. 10 is a flowchart describing a method for generating differential and quadrature harmonic signals using the VCO, according to an embodiment of the present invention.

Herein, it is assumed the VCO circuit is biased, as in the VCO circuit of FIG. 5B, and thus only RF signals will be considered. A first RF signal is generated by the oscillator of FIG. 5B, in operation S110. The first RF signal is input to the gate of the NMOS7. The first RF signal is phase inverted and is delayed for a designated amount of time, and applied to the drain of the NMOS7. As a result, a second RF signal is derived from the first RF signal, in operation S120. Later, the second RF signal is input to the gate of the NMOS6. The second RF signal is phase inverted and delayed for a designated amount of time, and applied to the drain of the NMOS6. As a result, a third RF signal is derived from the second RF signal, in operation S130. The third RF signal is input to the gate of the NMOS8. The third RF signal is phase inverted and is elayed for a designated amount of time, and applied to the drain of the NMOS8. As a result, a fourth RF signal is derived from the third RF signal, in operaiton S140. The fourth RF signal is input to the gate of the NMOS5. The third RF signal is phase inverted and delayed for a designated amount of time, and applied to the drain of the NMOS5. As a result, the first RF signal is derived from the fourth RF signal, in operation S150. At the OUT3, the first and third RF signals are combined, and as a result, a fifth RF signal is generated. Likewise, at the OUT6, the second and fourth RF signals are combined, and as a result, a sixth RF signal is generated, in operation S160. If the first, second, third, and fourth RF signals have a 90-degree phase difference (that is, the first and third RF signals have a 180-degree phase difference, and the second and fourth RF signals have a 180-degree phase difference), most of the odd number harmonic signals of the fifth and the sixth RF signals are cancelled, while the signal magnitude of the even number harmonics is multiplied by two.

Referring to FIG. 5C, the first harmonic signal of the first, second, third, and fourth RF signals are detected through the detection circuit from the OUT11, the OUT41, the OUT21, and the OUT51, respectively, in operation S171, and, then, through the filter circuit, the second harmonic signal of the fifth and sixth RF signals are filtered from the OUT31 and the OUT61, respectively, in operation S173, Culminating in the completion of the detection of first harmonics and second harmonics, in operation S175.

In the case of performing down conversion, using the VCO, 2-step down conversion is possible, with a primary down conversion using the second harmonic signal and a secondary down conversion using the first harmonic signal. In this manner, a 2-step down conversion with a sliding proportional IF is possible with one single oscillator.

In conclusion, the present invention has the following advantages.

First, it is evident that the RF voltage output has been greatly improved. For example, the RF voltage at the first harmonic (2.6 GHz) is −16.8 dBm, and the RF voltage at the second harmonic (5.2 GHz) is −16.8 dBm.

Second, with an increase in the RF voltage, it is now possible to utilize particularly second harmonic signals, without much amplification. This consequently simplifies the circuit structure and manufacture costs. If the maximum oscillation frequency (fmax) of the transistor is 9 GHz, for example, there is no way to generate the first harmonic signal at 10 GHz (that is, because fmax<10 GHz, it is not possible to generate any frequency at 10 GHz). On the contrary, according to embodiments of the present invention, it is possible to generate the first harmonic at 5 GHz, and the second harmonic signal (10 GHz) thereof can be used. In general, the second harmonic has a very small magnitude. However, the improved structure of the VCO of the present invention makes it possible to increase the magnitude of the second harmonic. Therefore, it is possible to generate a 10 GHz signal from the transistor whose fmax is 9 GHz. Moreover, the magnitude of the second harmonic signals can be varied by adjusting the voltage.

If a supply voltage is reduced, the power dissipation can also be reduced by 30%.

Third, the tuning range is also improved.

According to an embodiment of the present invention, the first quadrature harmonic can be generated from four output ports, and the second differential harmonic can be generated from two output ports. Also, the VCO of the invention can be used for a combiner, as a constituent element of a simplified wireless transmitter and receiver. Furthermore, it can generate local oscillator signals with precise phase differences. Because a doubled VCO signal is fixed at the half frequency, pulling problem of the VCO caused by the combination of the PA output and the VCO can be resolved.

In addition, one VCO is sufficient for a double conversion receiver, and one PLL is enough for stabilization. As a result, manufacture costs can be greatly reduced, and the VCO structure can become more simplified.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

Thus, although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A voltage controlled oscillator (VCO), comprising:
   a first oscillation unit for generating first and third signals;
   a first combining unit for combining the first and third signals;
   a second oscillation unit for generating second and fourth signals; and
   a second combining unit for combining the second and fourth signal, wherein a phase of the second signal results from a phase-invert and delay based on the first signal, a phase of the third signal results from a phase-invert and delay based on the second signal, a phase of the fourth signal results from a phase-invert and delay based on the third signal, and a phase of the first signal results from a phase-invert and delay based on the fourth signal.

2. The VCO according to claim 1, further comprising:
a first detection unit for detecting first harmonics of the first, second, third, and fourth signals, respectively; and
a second detection unit for detecting second harmonics of the first and second combining units, respectively.

3. The VCO according to claim 1, wherein the first harmonics of the first and third signals are differential signals, the first harmonics of the second and fourth signals are differential signals, and the first harmonics of the first and second signals are quadrature signals.

4. The VCO according to claim 1, wherein the second harmonic signals detected from the first and second combining units are differential signals.

5. The VCO according to claim 1, wherein the first and second oscillation units respectively comprise a tank circuit comprising at least one inductor and at least two variable capacitors.

6. The VCO according to claim 1 wherein the first combining unit comprises a node where the first and third signals are combined, with the node being connected to a first resistance connected to ground, and the second combining unit comprises a node where the second and fourth signals are combined, with the node being connected to a second resistance connected to ground.

7. The VCO according to claim 1, wherein a frequency of the first, second, third, and fourth signals vary, according to a change in tuning voltage.

8. The VCO according to claim 1, wherein the first oscillation unit comprises:
a first transistor having a source connected to ground;
a second transistor having a drain connected to a gate of the first transistor, a gate connected to a drain of the first transistor, and a source commonly connected to the source of the first transistor and to ground;
a fifth transistor having a drain connected to the drain of the first transistor; and
a sixth transistor having a drain connected to the drain of the second transistor,
wherein the second oscillation unit comprises:
a third transistor having a source connected to ground;
a fourth transistor having a drain connected to a gate of the third transistor, a gate connected to a drain of the third transistor, and a source commonly connected to the source of the third transistor and to ground;
a seventh transistor having a drain connected to the drain of the third transistor; and
an eighth transistor having a drain connected to a drain of the fourth transistor, wherein a gate of the seventh transistor is connected to the drain of the first transistor, the drain of the third transistor is connected to the gate of the sixth transistor, a gate of the eighth transistor is connected to the drain of the second transistor, and the drain of the fourth transistor is connected to a gate of the fifth transistor.

9. The VCO according to claim 8, wherein the first through eighth transistors are NMOS transistors.

10. The VCO according to claim 8, wherein the first combining unit comprises a first resistance, having one end of the first resistance commonly connected to the source of the fifth transistor and the source of the sixth transistor and another end of the first resistance being connected to ground, and the second combining unit comprises a second resistance, having one end of the second resistance commonly connected to the source of the seventh transistor and the source of the eighth transistor and another end of the second resistance being connected to ground.

11. The VCO according to claim 10, wherein the first oscillation unit further comprises:
a first inductor, with one end of the first inductor connected to the drain of the first transistor and another end of the first inductor being connected to the drain of the second transistor;
a first voltage;
a first capacitor, with one end of the first capacitor connected to the one end of the first inductor and another end of the first capacitor being connected to the first voltage;
a second capacitor, with one end of the second capacitor commonly connected to the other end of the first capacitor and the first voltage, and another end of the second capacitor being connected to the other end of the first inductor;
a second voltage;
a ninth transistor, with a drain of the ninth transistor connected to the one end of the first capacitor, and a source of the ninth transistor connected to the second voltage; and
a tenth transistor, with a source of the tenth transistor connected to the second voltage, and a drain of the tenth transistor connected to the other end of the second capacitor, and a gate of the tenth transistor connected to a drain of the ninth transistor,
wherein the second oscillation unit comprises:
a second inductor, with one end of the second inductor connected to the drain of the third transistor and another end of the second inductor being connected to the drain of the fourth transistor;
a third voltage;
a third capacitor, with one end of the third capacitor connected to the one end of the second inductor and another end of the third capacitor being connected to the third voltage;
a fourth capacitor, with one end of the fourth capacitor commonly connected to the other end of the third capacitor and the third voltage, and another end of the fourth capacitor being connected to the other end of the second inductor;
a fourth voltage;
an eleventh transistor, with a drain of the eleventh transistor connected to the one end of the third capacitor, and a source of the eleventh transistor being connected to the fourth voltage; and
a twelfth transistor, with a source of the twelfth transistor connected to the fourth voltage, and a drain of the twelfth transistor connected to the other end of the fourth capacitor, and a gate of the twelfth transistor being connected to a drain of the eleventh transistor.

12. The VCO according to claim 11, wherein the first through eighth transistors are NMOS transistors, and the ninth through twelfth transistors are PMOS transistors.

13. The VCO according to claim 11, wherein the first, second, third, and fourth capacitors are variable capacitors.

14. The VCO according to claim 11, wherein the second and fourth voltages are 1.8V, and the first and third voltages are variable voltages.

15. The VCO according to claim 11, further comprising:
a first detection circuit connected to the one end of the first capacitor for detecting a first harmonic of the first signal;
a second detection circuit connected to the one end of the third capacitor for detecting a first harmonic of the second signal;

a third detection circuit connected to the other end of the second capacitor for detecting a first harmonic of the third signal;

a fourth detection circuit connected to the other end of the second capacitor for detecting a first harmonic of the fourth signal;

a fifth detection circuit connected to the one end of the first resistance for detecting a second harmonic of the fifth signal; and a sixth detection circuit connected to the one end of the second resistance for detecting a second harmonic of the sixth signal.

16. The VCO according to claim 15, wherein the first through fourth detection circuits each respectively further comprise:

another resistance with one end connected to ground;

another capacitor, with one end of the other capacitor connected to another end of the other resistance and another end of the other capacitor being connected to ground; and a buffer with one end connected to the one end of the capacitor, wherein the fifth and sixth detection circuits respectively each comprise a further capacitor having one end connected to ground.

17. The VCO according to claim 16, wherein the first harmonics of the first and third signals are differential signals, the first harmonics of the first and fourth signals are quadrature signals, and the second harmonics of the fifth and sixth signals are differential signals.

18. A method for generating a differential and/or quadrature harmonic signal, comprising:

generating a first RF signal;

receiving and delaying the first RF signal for a designated time and generating a second RF signal;

receiving and delaying the second RF signal for a designated time and generating a third RF signal;

receiving and delaying the third RF signal for a designated time and generating a fourth RF signal; and receiving and delaying the fourth RF signal for a designated time and generating the first RF signal, wherein a phase difference between the first RF signal and the third RF signal is substantially 180°.

19. The method according to claim 18, further comprising:

combining the first and third RF signals to generate a fifth RF signal, and combining the second and fourth RF signals to generate a sixth RF signal.

20. The method according to claim 19, further comprising:

detecting second harmonic signals of the fifth and sixth RF signals.

21. The method according to claim 19, further comprising:

detecting first harmonic signals of the first, second, third, and fourth RF signals, respectively, and detecting second harmonic signals of the fifth and sixth RF signals, respectively.

22. The method according to claim 18, wherein phase differences between the second and third RF signals, the third and fourth RF signals, and the fourth and the first RF signals are each 90°, respectively.

23. The method according to claim 18, further comprising:

detecting first harmonic signals for the first, second, third, and fourth RF signals.

24. The method according to claim 18, further comprising:

generating a difference signal between an input frequency RF signal and a second harmonic signal of the fifth and sixth RF signals by mixing the input frequency RF signal and the second harmonic signal, mixing the difference signal with a first harmonic of the first, second, third, and fourth RF signals multiplied by a set variable to generate a stepped down signal of the input frequency RF signal, and outputting the stepped down signal of the input frequency RE signal.

25. A down-conversion method using a voltage controlled oscillator, comprising:

generating a first RF signal from the voltage controlled oscillator;

receiving and delaying the first RF signal for a designated time and generating a second RF signal;

receiving and delaying the second RF signal for a designated time and generating a third RF signal;

receiving and delaying the third RF signal for a designated time and generating a fourth RF signal;

receiving and delaying the fourth RF signal for a designated time and generating the first RF signal;

combining the first and third RF signals to generate a fifth RF signal, and combining the second and fourth RF signals to generate a sixth RF signal;

detecting first harmonic signals of the first, second, third, and fourth RF signals, respectively, and detecting second harmonic signals of the fifth and sixth RF signals; and performing a primary down-conversion based on the second harmonic signals, and performing a secondary down-conversion based on the first harmonic signals.

26. A method for generating a differential and/or quadrature harmonic signal, comprising:

generating a first RF signal;

receiving and delaying the first RF signal for a designated time and generating a second RF signal;

receiving and delaying the second RF signal for a designated time and generating a third RF signal;

receiving and delaying the third RF signal for a designated time and generating a fourth RF signal;

receiving and delaying the fourth RF signal for a designated time and generating the first RF signal; and combining the first and third RF signals to generate a fifth RF signal, and combining the second and fourth RF signals to generate a sixth RF signal, such that a phase difference between the fifth RF signal and the sixth RF signal is substantially 180°.

27. The method according to claim 26, further comprising:

generating a difference signal between an input frequency RF signal and a second harmonic signal of the fifth and sixth RF signals by mixing the input frequency RF signal and the second harmonic signal, mixing the difference signal with a first harmonic of the first, second, third, and fourth RF signals multiplied by a set variable to generate a stepped down signal of the input frequency RF signal, and outputting the stepped down signal of the input frequency RE signal.

* * * * *

UNITED STATES PATENT AND TRADEMARK OFFICE
CERTIFICATE OF CORRECTION

| | |
|---|---|
| PATENT NO. | : 7,383,033 B2 |
| APPLICATION NO. | : 11/056522 |
| DATED | : June 3, 2008 |
| INVENTOR(S) | : Kuhnert Holger |

Page 1 of 1

It is certified that error appears in the above-identified patent and that said Letters Patent is hereby corrected as shown below:

Column 15, Line 18, in Claim 6, after "1" insert --,--.

Column 18, Line 15, change "RE" to --RF--.

Column 18, Line 64, change "RE" to --RF--.

Signed and Sealed this

Seventh Day of October, 2008

JON W. DUDAS
*Director of the United States Patent and Trademark Office*